US012787601B2

(12) United States Patent
Baek et al.

(10) Patent No.: US 12,787,601 B2
(45) Date of Patent: Nov. 3, 2026

(54) DISPLAY DEVICE WITH EACH PIXEL HAVING CONNECTED LIGHT EMITTING ELEMENTS AND HAVING A DESIGN THAT REQUIRES MINIMAL REPAIRS

(71) Applicant: Samsung Display Co., LTD., Yongin-si (KR)

(72) Inventors: Sung Eun Baek, Yongin-si (KR); Jin Woo Choi, Yongin-si (KR); Sung Kook Park, Yongin-si (KR); Dae Ho Song, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 772 days.

(21) Appl. No.: 17/544,371

(22) Filed: Dec. 7, 2021

(65) Prior Publication Data

US 2022/0352267 A1 Nov. 3, 2022

(30) Foreign Application Priority Data

Apr. 30, 2021 (KR) ........................ 10-2021-0056894
Jun. 4, 2021 (KR) ........................ 10-2021-0073061

(51) Int. Cl.

| | |
|---|---|
| ***H01L 27/32*** | (2006.01) |
| ***H01L 51/52*** | (2006.01) |
| ***H10K 59/122*** | (2023.01) |
| ***H10K 59/80*** | (2023.01) |

(52) U.S. Cl.

CPC ..... *H10K 59/80521* (2023.02); *H10K 59/122* (2023.02)

(58) Field of Classification Search

CPC ..................................................... H10K 50/805
See application file for complete search history.

(56) References Cited

U.S. PATENT DOCUMENTS

| | | | | |
|---|---|---|---|---|
| 10,043,788 | B1 | 8/2018 | Han | |
| 2006/0231852 | A1* | 10/2006 | Kususe | H01L 33/62 257/79 |
| 2011/0012135 | A1 | 1/2011 | Chen et al. | |
| 2020/0381495 | A1* | 12/2020 | Jeon | H10K 59/121 |
| 2021/0013259 | A1 | 1/2021 | Ahn et al. | |
| 2021/0371968 | A1* | 12/2021 | Higuchi | C23C 14/042 |
| 2022/0352249 | A1 | 11/2022 | Park et al. | |

FOREIGN PATENT DOCUMENTS

| | | |
|---|---|---|
| CN | 102983283 | 3/2013 |
| CN | 103400834 A * | 11/2013 |
| KR | 10-2021-0006241 | 1/2021 |
| KR | 10-2022-0149889 | 11/2022 |

* cited by examiner

*Primary Examiner* — Peter Bradford
(74) *Attorney, Agent, or Firm* — CANTOR COLBURN LLP

(57) ABSTRACT

A display device includes a pixel, the pixel includes a first electrode; at least one light emitting element disposed on the first electrode; and a second electrode including at least one overlapping part overlapping the at least one light emitting element and including at least one opening not overlapping the at least one light emitting element, and a shape, a size, and a position of the overlapping part of the second electrode vary according to a position of the at least one light emitting element and a number of light emitting elements.

15 Claims, 26 Drawing Sheets

170: 170a, 170b

DISPLAY DEVICE WITH EACH PIXEL HAVING CONNECTED LIGHT EMITTING ELEMENTS AND HAVING A DESIGN THAT REQUIRES MINIMAL REPAIRS

CROSS-REFERENCE TO RELATED APPLICATION(S)

This application claims priority to and benefits of Korean Patent Application No. 10-2021-0056894 under 35 U.S.C. § 119 filed on Apr. 30, 2021 and Korean Patent Application No. 10-2021-0073061 under 35 U.S.C. § 119 filed on Jun. 4, 2021 in the Korean Intellectual Property Office, the entire contents of which are incorporated herein by reference.

BACKGROUND

1. Technical Field

The disclosure relates to a display device.

2. Description of the Related Art

With an increase in interest in an information display and an increase in demand to use portable information media, the demand for display devices is markedly increased, and commercialization thereof is in progress.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a cathode, by way of non-limiting example, that may minimize a repair risk in case that defective dark spots and/or bright spots of pixels occur.

An embodiment provides a display device that may include a pixel, wherein the pixel may include a first electrode; at least one light emitting element disposed on the first electrode; and a second electrode including at least one overlapping part overlapping the at least one light emitting element and including at least one opening not overlapping the at least one light emitting element, and a shape, a size, and a position of the overlapping part of the second electrode vary according to a position of the at least one light emitting element and a number of light emitting elements.

The overlapping part of the second electrode may overlap the at least one light emitting element.

The second electrode may include a first overlapping part, a second overlapping part, a third overlapping part, a fourth overlapping part, and a fifth overlapping part; and each of the first overlapping part, the second overlapping part, the third overlapping part, the fourth overlapping part, and the fifth overlapping part may overlap a corresponding one of the at least one light emitting element.

The second overlapping part may extend in a first diagonal direction from the first overlapping part; the third overlapping part may extend in a second diagonal direction from the second overlapping part; the fourth overlapping part may extend in the first diagonal direction from the third overlapping part; and the fifth overlapping part may extend in the second diagonal direction from the fourth overlapping part.

The third overlapping part may be spaced apart from the first overlapping part with at least one opening of the second electrode disposed between the third overlapping part and the first overlapping part in a vertical direction; the fourth overlapping part may be spaced apart from the second overlapping part with the at least one opening of the second electrode disposed between the fourth overlapping part and the second overlapping part in the vertical direction; and the fifth overlapping part may be spaced apart from the third overlapping part with the at least one opening of the second electrode disposed between the fifth overlapping part and the third overlapping part in the vertical direction.

The pixel may include a first sub-pixel, a second sub-pixel, and a third sub-pixel disposed side by side in a horizontal direction; each of the first subpixel, the second sub-pixel, and the third sub-pixel may include the first electrode, the at least one light emitting element, and the second electrode; and overlapping parts of the first subpixel, the second sub-pixel, and the third sub-pixel may extend from each other.

The second overlapping part of the first sub-pixel may extend from the third overlapping part of the second sub-pixel in the first diagonal direction, and may extend from the first overlapping part of the second sub-pixel in the second diagonal direction; and the third overlapping part of the third sub-pixel may extend from the second overlapping part of the second sub-pixel in the first diagonal direction, and may extend from the fourth overlapping part of the second sub-pixel in the second diagonal direction.

The second electrode may include a first overlapping part, a second overlapping part, a third overlapping part, a fourth overlapping part, and a bridge; and each of the first overlapping part, the second overlapping part, the third overlapping part, and the fourth overlapping part may overlap a corresponding one of the at least one light emitting element.

The second overlapping part may extend in a first diagonal direction from the first overlapping part through the bridge; the third overlapping part may extend in a second diagonal direction from the second overlapping part through the bridge; the fourth overlapping part may extend in the first diagonal direction from the third overlapping part through the bridge; the third overlapping part may be spaced apart from the first overlapping part with the opening of the second electrode disposed between the third overlapping part and the first overlapping part in a vertical direction; and the fourth overlapping part may be spaced apart from the second overlapping part with the opening of the second electrode disposed between the fourth overlapping part and the second overlapping part in the vertical direction.

The pixel may include a first sub-pixel, a second sub-pixel, and a third sub-pixel disposed side by side in a horizontal direction; each of the first sub-pixel, the second sub-pixel, and the third sub-pixel may include the first electrode, the at least one light emitting element, and the second electrode; and the overlapping parts of the first sub-pixel, the second sub-pixel, and the third sub-pixel may extend from each other through the bridge.

The second overlapping part of the first sub-pixel may extend from the third overlapping part of the second sub-pixel in the first diagonal direction through the bridge, and may extend from the first overlapping part of the second sub-pixel in the second diagonal direction through the bridge; and the second overlapping part of the second sub-pixel may extend from the third overlapping part of the third sub-pixel in the first diagonal direction through the bridge, and may extend from the first overlapping part of the third sub-pixel in the second diagonal direction through the bridge.

An edge of the overlapping part of the first sub-pixel overlapping an x-th light emitting element of the at least one light emitting element of the first sub-pixel may be cut in case that a dark spot defect occurs in the x-th light emitting element, where x is a natural number.

An edge of the second electrode overlapping the third sub-pixel may be cut in case that a bright spot occurs in the third sub-pixel.

An embodiment provides a display device that may include a pixel, wherein the pixel may include a first electrode; at least one light emitting element disposed on the first electrode; and a second electrode including a pattern part overlapping the at least one light emitting element and an opening not overlapping the at least one light emitting element.

The pattern part may overlap the at least one light emitting element, and sizes and shapes of the at least one light emitting element may vary according to positions and numbers of the at least one light emitting element.

The at least one light emitting element may be disposed in a zigzag pattern in a first diagonal direction and a second diagonal direction; and the pattern part of the second electrode may have a zigzag pattern overlapping the at least one light emitting element.

An embodiment provides a display device that may include a pixel, wherein the pixel may include a first electrode; at least one light emitting element disposed on the first electrode; and a second electrode including a plate part overlapping the at least one light emitting element; a bridge extending from the plate part; and at least one opening not overlapping the at least one light emitting element.

The second electrode may include a first plate part and a second plate part; the first plate part and the second plate part may extend through the bridge in a vertical direction; and the at least one opening of the second electrode may be disposed between the first plate part and the second plate part.

The pixel may include a first sub-pixel, a second sub-pixel, and a third sub-pixel disposed side by side in a horizontal direction; each of the first sub-pixel, the second sub-pixel, and the third sub-pixel may include the first electrode, the at least one light emitting element, and the second electrode; and plate parts of the first sub-pixel, the second sub-pixel, and the third sub-pixel may extend from each other through the bridge.

A first plate part of the first sub-pixel may extend through the bridge from a first plate part of the second sub-pixel in a horizontal direction; and a second plate of the first sub-pixel may extend through the bridge from a second plate of the second sub-pixel in the horizontal direction.

An embodiment provides a display device that may include a pixel, wherein the pixel may include a first electrode; at least one light emitting element disposed on the first electrode; and a second electrode including an upper plate part overlapping the at least one light emitting element; a lower plate part spaced apart from the upper plate part with an opening formed between the lower plate part and the upper plate part; and a bridge extending from respective adjacent corners of the upper plate part and the lower plate part.

The pixel may include a first sub-pixel, a second sub-pixel, and a third sub-pixel disposed side by side in a horizontal direction; and the bridge may extend from respective adjacent corners of an upper plate part of the first sub-pixel, a lower plate part of the first sub-pixel, an upper plate part of the second sub-pixel, and a lower plate part of the second sub-pixel.

A distance between a first electrode of the first sub-pixel and a first electrode of the second sub-pixel may be greater than a width of the bridge.

A distance between a side of the upper plate part and a side of the lower plate part may be equal to or greater than a distance between a side of a second electrode of the first sub-pixel and a side of a second electrode of the second sub-pixel.

According to an embodiment, in case that a dark spot defect and/or a bright spot defect of a pixel occurs, a repair risk may be minimized by various shapes of cathodes.

Effects of an embodiment are not limited by what is illustrated in the above, and more various effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
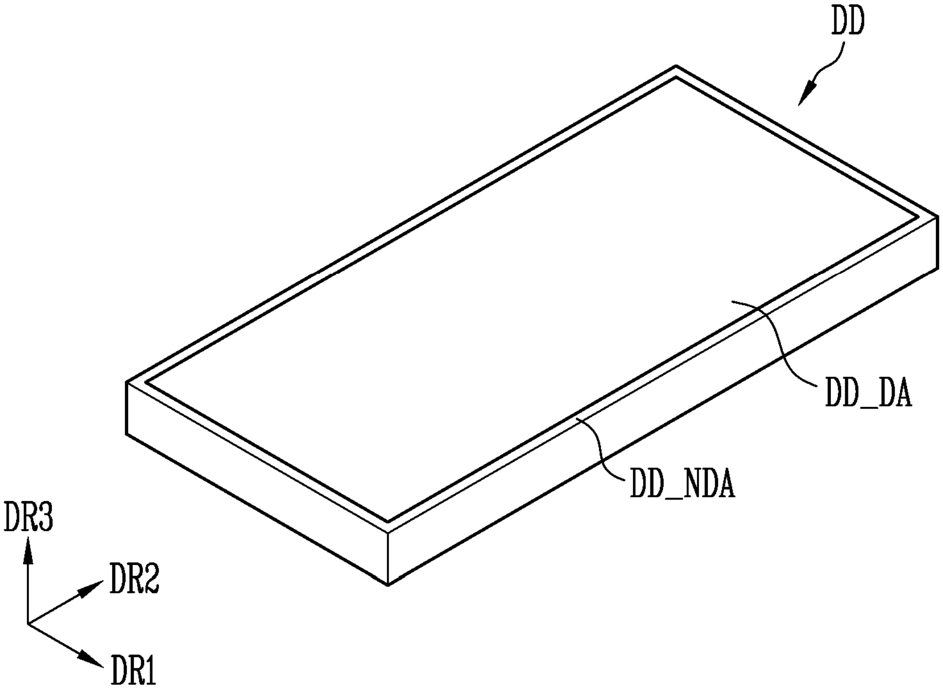
FIG. 1 illustrates a schematic perspective view of a display device according to an embodiment.

Since the disclosure may be variously modified and have various forms, embodiments will be illustrated and described in detail in the following. This, however, by no means restricts the disclosure to the described and illustrated embodiments, and it is to be understood as embracing all included in the spirit and scope of the disclosure changes, equivalents, and substitutes.

In the drawings, sizes, thicknesses, ratios, and dimensions of the elements may be exaggerated for ease of description and for clarity. Like numbers refer to like elements throughout.

Terms such as first, second, and the like will be used only to describe various constituent elements, and are not to be interpreted as limiting these constituent elements. The terms are only used to differentiate one constituent element from other constituent elements. For example, a first constituent element could be termed a second constituent element, and similarly, a second constituent element could be termed as a first constituent element, without departing from the scope of the disclosure. Singular forms are intended to include plural forms unless the context clearly indicates otherwise. For example, as used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

In the application, it should be understood that the term "include", "comprise", "have", or "configure" or variations thereof indicates that a feature, a number, a step, an operation, a constituent element, a part, or a combination thereof described in the specification is present, but does not exclude a possibility of presence or addition of one or more other features, numbers, steps, operations, constituent elements, parts, or combinations, in advance.

It will be understood that when an element such as a layer, film, region, area, or substrate is referred to as being "on" another element, it can be directly on the other element or intervening elements may also be present. In addition, in the specification, when a part of a layer, film, region, area, plate, or the like is referred to as being formed "on" another part, the formed direction is not limited to an upper direction but includes a lateral or lower direction. In contrast, when an element of a layer, film, region, plate, or the like is referred to as being "below" another element, it may be directly below the other element, or intervening elements may be present.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display device according to an embodiment will be described with reference to drawings related to an embodiment.

Figure 2:
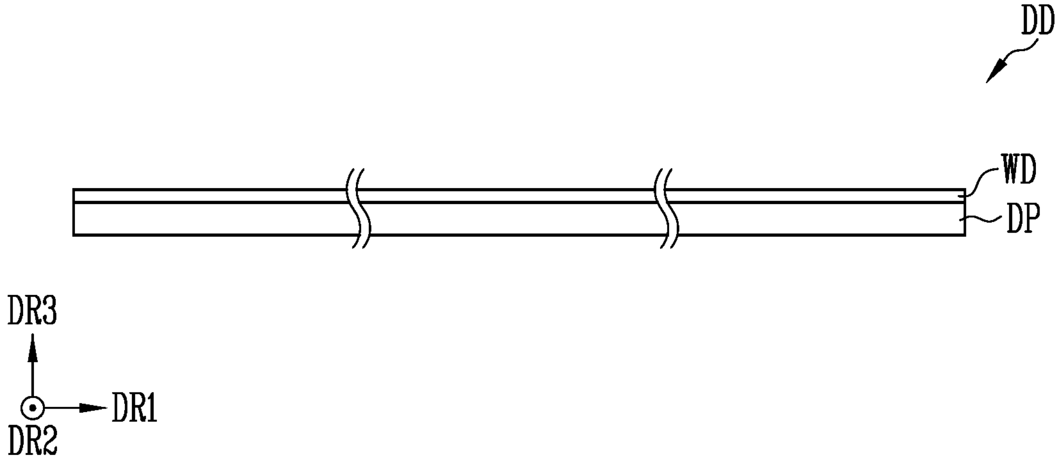
FIG. 2 illustrates a schematic cross-sectional view of the display device of FIG. 1.
Figure 3:
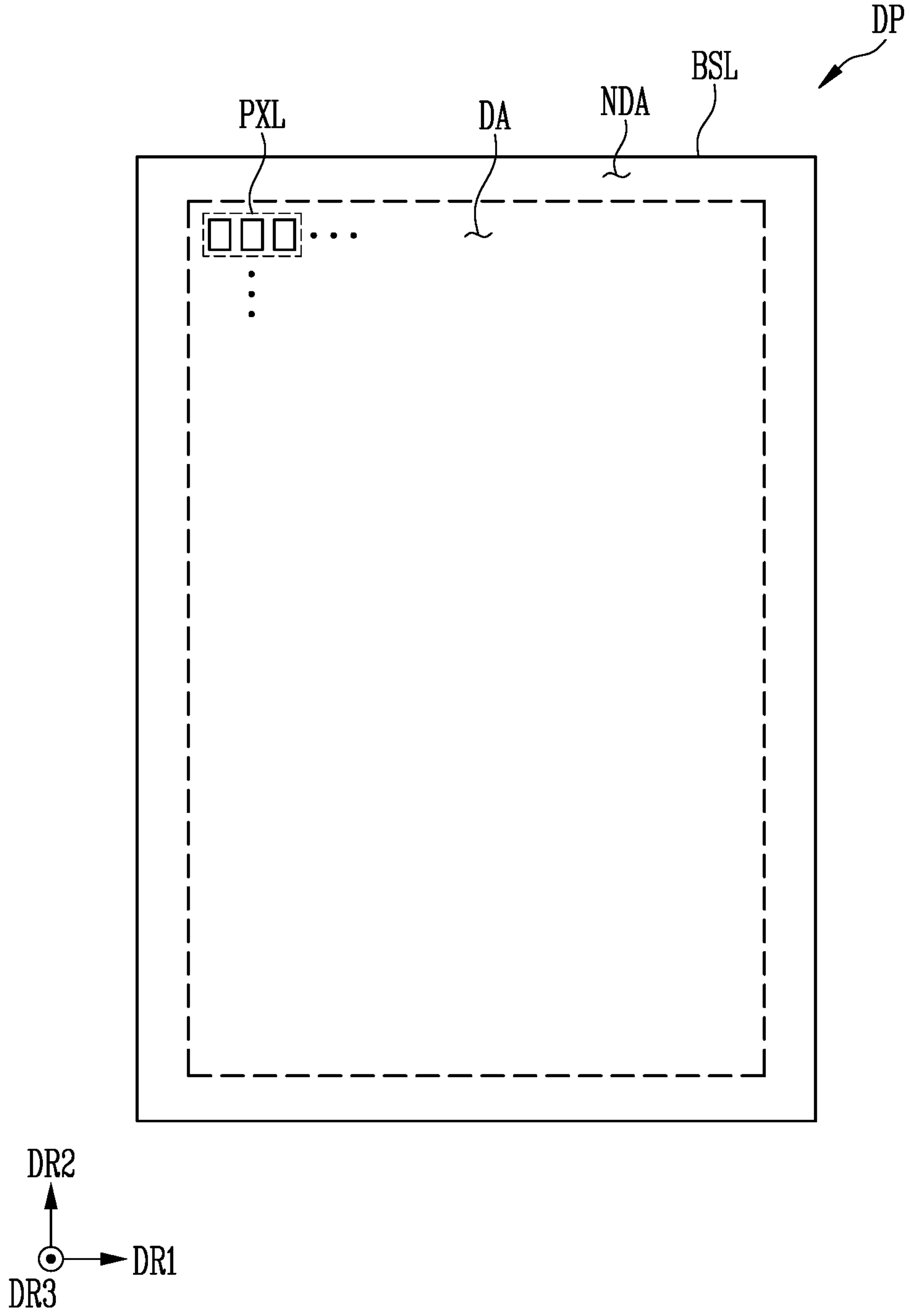
FIG. 3 illustrates a schematic top plan view of a display panel according to an embodiment.
Figure 4:
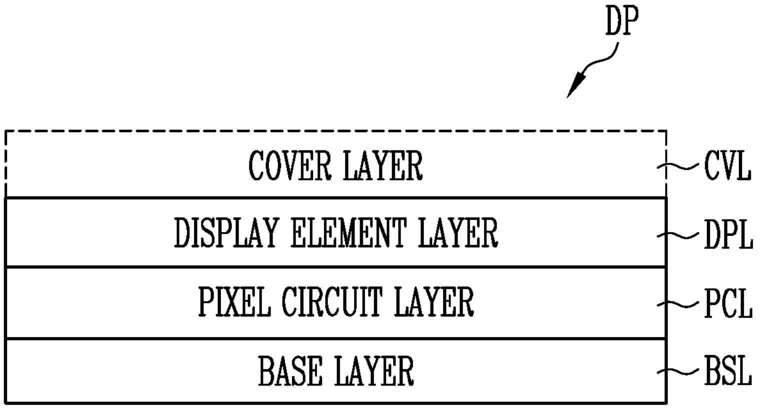
FIG. 4 illustrates a schematic cross-sectional view of a display panel according to an embodiment.

FIG. 1 illustrates a schematic perspective view of a display device according to an embodiment, FIG. 2 illustrates a schematic cross-sectional view of the display device of FIG. 1, FIG. 3 illustrates a schematic top plan view of a display panel according to an embodiment, and FIG. 4 illustrates a schematic cross-sectional view of a display panel according to an embodiment.

Referring to FIG. 1 to FIG. 4, a display device DD may include a display panel DP and a window WD.

The display device DD may include a display area DD_DA that displays an image and a non-display area DD NDA that does not display an image. The non-display area DD NDA may be provided on at least one side or a side of the display area DD_DA, and may be provided to surround the display area DD_DA or to be adjacent to the display area DD_DA. In an embodiment, a shape of the display area DD_DA and a position of the non-display area DD NDA may be relatively designed.

The display device DD may be provided in a form of a plate having a rectangular shape or a substantially a rectangular shape with substantially angled corners, but in an embodiment, the display device DD may be realized in a form of a plate having a substantially rectangular shape with substantially rounded corners. The disclosure is not limited thereto, and the display device DD may be implemented in various shapes.

The display device DD according to an embodiment may be applied to an electronic device in which a display surface is applied to at least one surface or a surface thereof such as a smart phone, a television, a tablet PC, a mobile phone, an image phone, an electron book reader, a desktop PC, a laptop PC, a netbook computer, a workstation, a server, a PDA, a portable multimedia player (PMP), an MP3 player, a medical device, a camera, or a wearable display device.

The display panel DP is an area that displays an image. The display panel DP may be realized as a self-emission display panel such as an organic light emitting display (OLED) panel, a nano-scale LED display panel, and a quantum dot organic light emitting display (QD OLED) panel.

The display panel DP may include a base layer BSL and pixels PXL disposed on the base layer BSL.

The base layer BSL may form a base member of the display device DD. In an embodiment, the base layer BSL may be a rigid or flexible substrate or film, and its material or physical properties are not particularly limited. For example, the base layer BSL may be formed as a rigid substrate made of glass or tempered glass, as a flexible substrate (or a thin film) made of a plastic or metallic material, or as at least one layer or a layer of insulating film, but its material and/or physical properties are not particularly limited.

The base layer BSL may include a display area DA that displays an image and a non-display area NDA excluding the display area DA. The non-display area NDA is an area in which no image is displayed, and may be a bezel area surrounding or adjacent to the display area DA. Here, the display area DA of the display panel DP may correspond to the display area DD_DA of the display device DD, and the non-display area NDA of the display panel DP may be correspond to the non-display area DD NDA of the display device DD.

The display area DA may be disposed on one surface or on a surface of the display panel DP. For example, the display area DA may be disposed on a front side of the display panel DP, and may additionally be disposed on a side or rear surface of the display panel DP.

The non-display area NDA may be disposed around the display area DA to surround the display area DA or may be adjacent to the display area DA. The non-display area NDA may selectively include wires, pads, and a driving circuit connected to the pixels PXL of the display area DA.

In FIG. 3, only one pixel PXL including three sub-pixels is illustrated, but pixels PXL may be substantially dispersed and disposed in the display area DA. For example, the pixels PXL may be disposed in the display area DA to have an arrangement structure such as a matrix or stripe. However, the disclosure is not limited thereto.

The display panel DP may include a pixel circuit layer PCL, a display element layer DPL, and a cover layer CVL that may be sequentially disposed on the base layer BSL.

The pixel circuit layer PCL may be disposed on the base layer BSL, and may include transistors and signal lines connected to the transistors. For example, each transistor may have a structure in which a semiconductor pattern, a gate electrode, a source electrode, and a drain electrode may be sequentially stacked each other with an insulating layer interposed therebetween.

The display element layer DPL may be disposed on the pixel circuit layer PCL, and may include light emitting elements. For example, the light emitting element may be an organic light emitting diode, an inorganic light emitting element, or a light emitting element that emits light by changing a wavelength of light emitted by using quantum dots.

The cover layer CVL may be disposed on the display element layer DPL. The cover layer CVL may be an encapsulation substrate or a multi-layered encapsulation film. In case that the cover layer CVL is in the form of the encapsulation film, it may have a structure in which an inorganic film, an organic film, and an inorganic film may be sequentially stacked each other. The cover layer CVL may prevent external air and moisture from penetrating into the display element layer DPL and the pixel circuit layer PCL.

In an embodiment, the cover layer CVL may be made of a heat and/or photo-curable resin and coated on the base layer BSL in a liquid form, and cured by a curing process using heat and/or light. The cover layer CVL may protect the light emitting element and stably fix the light emitting element.

The window WD for protecting an exposed surface of the display panel DP may be provided on the display panel DP. The window WD may protect the display panel DP from external impact, and may provide an input surface and/or a display surface to a user. The window WD may be combined with the display panel DP by using an optically clear adhesive member.

The window WD may have a multi-layered structure selected from a glass substrate, a plastic film, and a plastic substrate. Such a multi-layered structure may be formed through a continuous process or an adhesive process using an adhesive layer. The window WD may be entirely or partially flexible.

A touch sensor may be disposed between the display panel DP and the window WD. The touch sensor may be disposed on or directly disposed on a surface of the display panel DP on which an image is displayed to receive a user's touch input.

Hereinafter, a pixel included in a display device or display panel according to an embodiment will be described with reference to FIG. 5.

Figure 5:
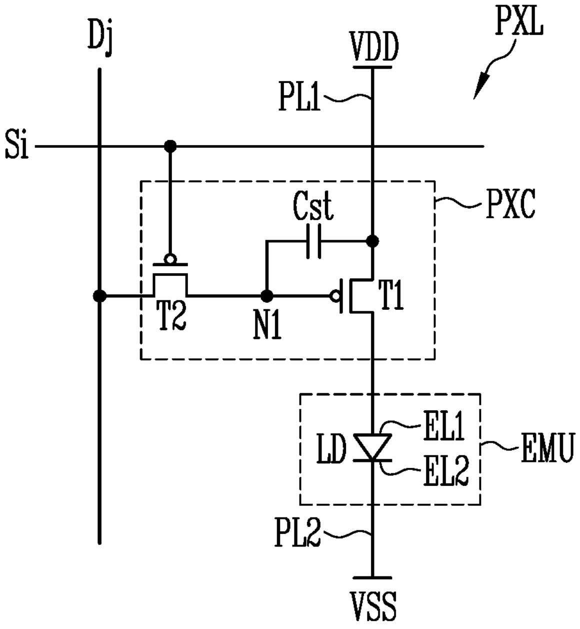
FIG. 5 illustrates a schematic diagram of an equivalent circuit of an electrical connection relationship of one pixel included in a display device according to an embodiment.

FIG. 5 illustrates a schematic diagram of an equivalent circuit of an electrical connection relationship of one pixel included in a display device according to an embodiment.

Referring to FIG. 5, one pixel PXL may include at least one light emitting unit EMU that generates luminance light corresponding to a data signal. One pixel PXL may further selectively include a pixel circuit PXC for driving the light emitting unit EMU.

The light emitting unit EMU may include a light emitting element LD connected between a first power line PL1 to which a voltage of a first driving power source VDD is applied and a second power line PL2 to which a voltage of a second driving power source VSS is applied.

By way of example, the light emitting unit EMU may include a first electrode EL1 connected to the first power source VDD via the pixel circuit PXC and the first power line PL1, a second electrode EL2 connected to the second power source VSS via the second power line PL2, and a light emitting elements LD connected between the first electrode EL1 and the second electrode EL2. In an embodiment, the first electrode EL1 may be an anode, and the second electrode EL2 may be a cathode.

The light emitting element LD included in the light emitting unit EMU may include one end (or first end) connected to the first driving power source VDD through the first electrode EL1 and the other end (or second end) connected to the second driving power source VSS through the second electrode EL2.

The first driving power source VDD and the second driving power source VSS may have different potentials. For example, the first driving power source VDD may be set as a high potential power source, and the second driving power source VSS may be set as a low potential power source. A potential difference between the first driving power source VDD and the second driving power source VSS may be set to be equal to or higher than a threshold voltage of the light emitting element LD during a light emitting period of the pixel PXL.

The light emitting element LD of the light emitting unit EMU may emit light with luminance corresponding to a driving current supplied through the pixel circuit PXC. For example, during each frame period, the pixel circuit PXC may supply a driving current corresponding to a gray value of one frame data to the light emitting unit EMU. The driving current supplied to the light emitting unit EMU may flow in the light emitting element LD.

One light emitting element LD is shown in FIG. 5, but the disclosure is not limited thereto. In an embodiment, the light emitting unit EMU may include light emitting elements that may be connected to each other in parallel in a same direction between the first electrode EL1 and the second electrode EL2, and the light emitting elements may form a series/parallel mixed structure connected in n series stages.

The pixel circuit PXC may be connected to a scan line Si and a data line Dj of one pixel PXL. For example, in case that the pixel PXL may be disposed in an i-th (i is a natural number) row and a j-th (j is a natural number) column of the display area DA (see FIG. 3), the pixel circuit PXC of the pixel PXL may be connected to an i-th scan line Si and a j-th data line Dj of the display area DA.

The pixel circuit PXC may include a first transistor T1, a second transistor T2, and a storage capacitor Cst.

A first terminal of the first transistor T1 (or driving transistor) may be connected to the first driving power supply source VDD, and a second terminal thereof may be electrically connected to the first electrode EL1 of the light emitting unit EMU. A gate electrode of the first transistor T1 may be connected to a first node N1. Accordingly, the first transistor T1 may control an amount of driving current supplied to the light emitting element LD in response to a voltage of the first node N1.

A first terminal of the second transistor T2 (or switching transistor) may be connected to the data line Dj, and a second terminal thereof is connected to the first node N1. A gate electrode of the second transistor T2 may be connected to the scan line Si. The second transistor T2 is turned on in case that a scan signal (low level) of a turn-on voltage is supplied from the scan line Si, and electrically connects the data line Dj and the first node N1. In case that a data signal of one frame is supplied to the data line Dj, the data signal is transmitted to the first node N1. The data signal transmitted to the first node N1 is charged in the storage capacitor Cst.

One electrode of the storage capacitor Cst may be connected to the first node N1, and the other electrode thereof may be connected to the first terminal of the first transistor T1. The storage capacitor Cst may be charged with a voltage corresponding to a voltage difference between a voltage corresponding to a data signal supplied to the first node N1 and a voltage of the first terminal of the first transistor T1, and it may maintain the charged voltage until a data signal of a subsequent frame is supplied.

FIG. 5 illustrates an embodiment in which both the first transistor T1 and the second transistor T2 are P-type transistors, but the disclosure is not limited thereto. In an embodiment, at least one of the first transistor T1 and the second transistor T2 may be changed to an N-type transistor.

The structure of the pixel circuit PXC of FIG. 5 may be variously changed. For example, the pixel circuit PXC may additionally include other circuit elements such as a transistor for compensating a threshold voltage of the first transistor T1, a transistor for initializing a voltage of the first node N1, a transistor for controlling a light emitting time of the light emitting element LD, and a boosting capacitor for boosting a voltage of the first node N1.

Hereinafter, a light emitting element included in a display device and a pixel according to an embodiment will be described with reference to FIG. 6 and FIG. 7.

Figure 6:
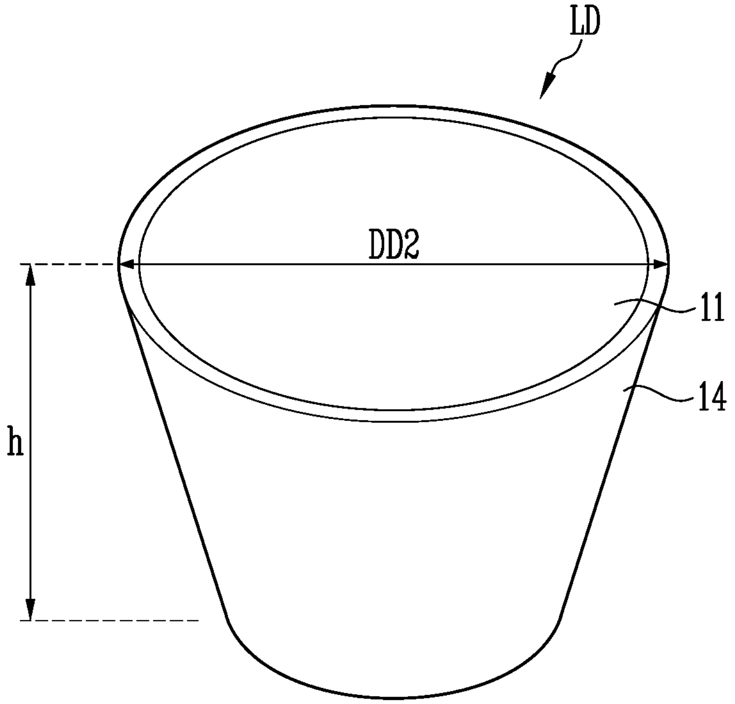
FIG. 6 illustrates a schematic perspective view of a light emitting element included in a display device according to an embodiment.
Figure 7:
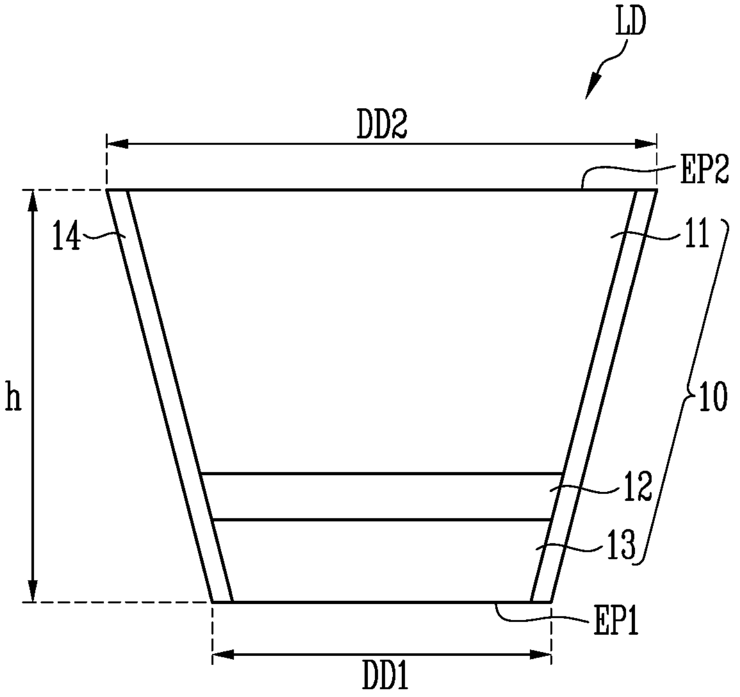
FIG. 7 illustrates a schematic cross-sectional view of a light emitting element included in a display device according to an embodiment.

FIG. 6 illustrates a schematic perspective view of a light emitting element included in a display device according to an embodiment, and FIG. 7 illustrates a schematic cross-sectional view of a light emitting element included in a display device according to an embodiment.

Referring to FIG. 6 and FIG. 7, the light emitting element LD may include a first semiconductor layer 11, an active layer 12, and a second semiconductor layer 13. For example, the light emitting element LD may be a light emitting stacked body 10 in which the first semiconductor layer 11, the active layer 12, and the second semiconductor layer 13 may be sequentially stacked each other. In an embodiment, the light emitting element LD may further include a bonding electrode layer, and the bonding electrode layer may be stacked on one surface or on a surface of the first semiconductor layer 11 or one surface or on a surface of the second semiconductor layer 13.

In a height h direction of the light emitting element LD, a lower surface may be referred to as a first end EP1, and an upper surface may be referred to as a second end EP2.

The light emitting element LD may have a substantially column shape in which a diameter DD1 of the first end EP1 and a diameter DD2 of the second end EP2 are different from each other. For example, the light emitting element LD may have a substantially column shape in which the diameter DD1 of the first end EP1 is smaller than the diameter DD2 of the second end EP2. By way of example, the light emitting element LD may have substantially elliptical column shape in which a diameter increases toward an upper along the height h direction.

The disclosure is not limited thereto, and in an embodiment, the light emitting element LD may have a substantially column shape in which the diameter DD1 of the first end EP1 is larger than the diameter DD2 of the second end EP2. In an embodiment, the light emitting element LD may have a substantially elliptical column shape in which a diameter decreases toward an upper surface or region along the height h direction.

In an embodiment, shapes of the first end EP1 and the second end EP2 of the light emitting element LD may be a polygon such as a rectangle, a square, an equilateral triangle, or a regular pentagon. In an embodiment, the light emitting element LD may have a substantially truncated pyramid shape in which an area of an upper surface thereof and an area of a lower surface thereof are different from each other.

The light emitting element LD may have a size of a nano-scale to a micro-scale. However, the size of the light emitting element LD is not limited thereto, and the size of the light emitting element LD may be variously changed according to design conditions of various devices (for example, a display device) using a light emitting device using the light emitting element LD as a light source.

The first semiconductor layer 11 may be a semiconductor layer of first conductivity (or type). For example, the first semiconductor layer 11 may include at least one N-type semiconductor. For example, the first semiconductor layer 11 may include a semiconductor material of one of InAlGaN, GaN, AlGaN, InGaN, AlN, and InN, and may include an N-type semiconductor layer doped with a first conductive dopant such as Si, Ge, Sn, or the like within the spirit and the scope of the disclosure. However, the material included in the first semiconductor layer 11 is not limited thereto, and the first semiconductor layer 11 may be made of various materials.

The active layer 12 may be disposed on one surface or on a surface of the first semiconductor layer 11. The active layer 12 may be disposed on the first semiconductor layer 11. The active layer 12 may have a single or multiple quantum well structure. In an embodiment, a clad layer doped with a conductive dopant may be formed at an upper part and/or a lower part of the active layer 12. For example, the clad layer may be formed as an AlGaN layer or an InAlGaN layer. In an embodiment, a material such as AlGaN and InAlGaN may be used to form the active layer 12, and in addition, various materials may form the active layer 12.

In case that a voltage of a threshold voltage or more is applied to the upper surface and the lower surface of the light emitting element LD, the light emitting device LD emits light while electron-hole pairs are combined in the active layer 12. By controlling the light emission of the light emitting element LD by using this principle, it may be used as a light source for various light emitting devices in addition to pixels of a display device.

The second semiconductor layer 13 may be disposed on one surface or on a surface of the active layer 12. The second semiconductor layer 13 may be disposed on the active layer 12. The second semiconductor layer 13 may include a semiconductor layer having a conductivity (or type) different from that of the first semiconductor layer 11. For example, the second semiconductor layer 13 may include at least one P-type semiconductor layer. For example, the second semiconductor layer 13 may include at least one semiconductor material of InAlGaN, GaN, AlGaN, InGaN, AlN, and InN, and may include a p-type semiconductor layer doped with a second conductive dopant such as Mg, Zn, Ca, Sr, or Ba. However, the material included in the second semiconductor layer 13 is not limited thereto, and the second semiconductor layer 13 may be formed of various materials.

It is illustrated that each of the first semiconductor layer 11 and the second semiconductor layer 13 are formed as one layer or a layer, but the disclosure is not limited thereto. In an embodiment, each of the first semiconductor layer 11 and the second semiconductor layer 13 may further include at least one or more layers, for example, a cladding layer and/or a tensile strain barrier reducing (TSBR) layer according to the material of the active layer 12. The TSBR layer may be a strain reducing layer disposed between semiconductor layers having different lattice structures and serving as a buffer to reduce a difference in lattice constant. The TSBR layer may be formed of a p-type semiconductor layer such as p-GaInP, p-AlInP, or p-AlGaInP, but the disclosure is not limited thereto.

In an embodiment, the light emitting element LD may further include an electrode disposed on the upper part of the first semiconductor layer 11 and/or the lower part the second semiconductor layer 13 in addition to the first semiconductor layer 11, the active layer 12, and second semiconductor layer 13 described above.

The electrode may be an ohmic contact electrode, but the disclosure is not limited thereto. In an embodiment, the electrode may be a schottky contact electrode. The electrode may include a conductive material. For example, the electrodes may include an opaque metal in which chromium (Cr), titanium (Ti), aluminum (Al), gold (Au), nickel (Ni), and an oxide or alloy thereof are used alone or in combination, but the disclosure is not limited thereto. In an embodiment, the electrodes may include a transparent conductive oxide such as an indium tin oxide (ITO), an indium zinc oxide (IZO), a zinc oxide (ZnO), an indium gallium zinc oxide (IGZO), and an indium tin zinc oxide (ITZO). The electrode may be a part in contact with or direct contact with an anode or a cathode.

In an embodiment, the light emitting element LD may further include an insulating film 14. In an embodiment, the insulating film 14 may be omitted, and may be provided to cover or overlap only a part of the light emitting stacked body 10.

The insulating film 14 may prevent an electrical short circuit that may occur in case that the active layer 12 contacts conductive materials other than the first and second semiconductor layers 11 and 13. The insulating film 14 may minimize surface defects of the light emitting element LD to improve lifespan and luminous efficiency of the light emitting element LD. In case that the light emitting elements LD are closely disposed, the insulating film 14 may prevent unwanted short circuits that may occur between the light emitting elements LD. As long as the active layer 12 may prevent a short circuit with an external conductive material from being caused, whether or not the insulating film 14 is provided is not limited.

The light emitting element LD may further include a reflective member surrounding an outer circumferential surface of the insulating film 14. The reflective member may be made of a material having a reflectivity in order to focus light emitted from the light emitting element LD to a specific or given area while proceeding in an image display direction. For example, the reflective member may be made of a conductive material (or substance) having a reflectivity.

Hereinafter, a structure of a display device according to an embodiment will be described with reference to FIG. 8.

Figure 8:
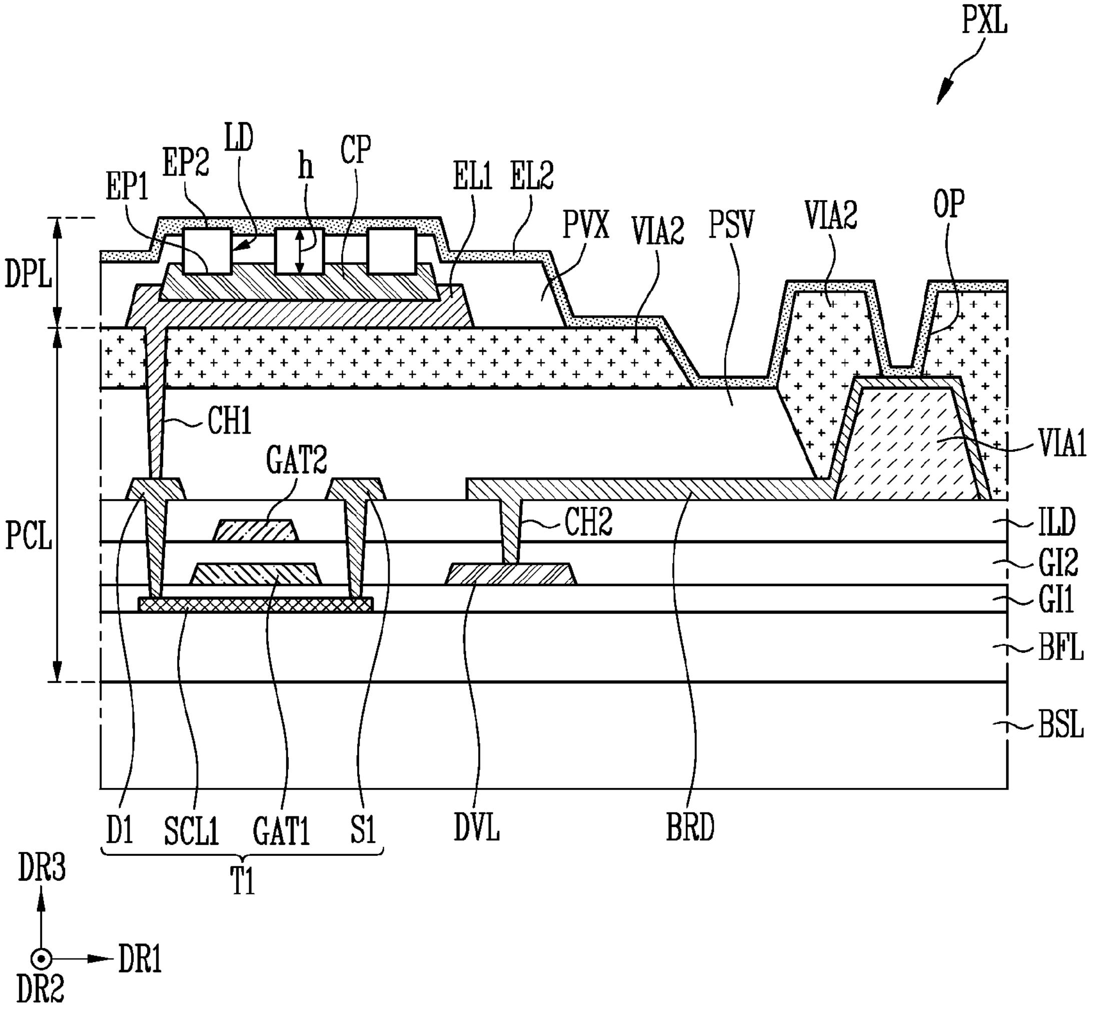
FIG. 8 illustrates a schematic cross-sectional view of a pixel included in a display device according to an embodiment.

FIG. 8 illustrates a schematic cross-sectional view of a pixel included in a display device according to an embodiment.

Referring to FIG. 8, one pixel PXL included in the display device according to an embodiment may include the base layer BSL, the pixel circuit layer PCL, and the display element layer DPL.

The base layer BSL may be a rigid or flexible substrate. For example, in case that the base layer BSL is a rigid substrate, the base layer BSL may be implemented with a glass substrate, a quartz substrate, a glass ceramic substrate, a crystalline glass substrate, or the like within the spirit and the scope of the disclosure. In case that the base layer BSL is a flexible substrate, the base layer BSL may be implemented with a polymer organic material substrate including polyimide, polyamide, and the like, a plastic substrate, or the like within the spirit and the scope of the disclosure.

The pixel circuit layer PCL may be disposed on the base layer BSL.

The pixel circuit layer PCL may include at least one transistor and wires connected to the at least one transistor. The pixel circuit layer PCL may include a buffer layer BFL, a first gate insulating layer GI1, a second gate insulating layer GI2, an interlayer insulating layer ILD, a first via layer VIA1, and a second via layer VIA2 that may be sequentially stacked each other on one surface or on a surface of the base layer BSL.

The buffer layer BFL may be disposed on the base layer BSL to cover or overlap the base layer BSL. The buffer layer BFL may prevent impurities from being diffused into the pixel circuit layer PCL from the outside. The buffer layer BFL may include at least one of metal oxides such as a silicon nitride ($SiN_x$), a silicon oxide ($SiO_x$), a silicon oxynitride ($SiO_xN_y$), and an aluminum oxide ($AlO_x$). In an embodiment, the buffer layer BFL may be omitted. A lower metal layer may be disposed between the base layer BSL and the buffer layer BFL.

A first transistor T1 may include a first semiconductor pattern SCL1, a first gate electrode GAT1, a first source electrode S1, and a first drain electrode D1.

The first semiconductor pattern SCL1 may be disposed on the buffer layer BFL. The first semiconductor pattern SCL1 may include a channel region, and a source region and a drain region disposed at both sides of the channel region. The source region of the first semiconductor pattern SCL1 may be electrically connected to the first source electrode S1, and the drain region thereof may be electrically connected to the first drain electrode D1. For example, the source region and the drain region may be expanded to be electrically connected to electrodes of different layers through contact holes, respectively.

The first semiconductor pattern SCL1 may include at least one of polysilicon, amorphous silicon, and an oxide semiconductor.

The first gate insulating layer GI1 may be disposed on the first semiconductor pattern SCL1 and the buffer layer BFL. The first gate insulating layer GI1 covers or overlaps the first semiconductor pattern SCL1 and the buffer layer BFL.

The first gate insulating layer GI1 may include an inorganic material. For example, the first gate insulating layer GI1 may include at least one of a silicon nitride ($SiN_x$), a silicon oxide ($SiO_x$), a silicon oxynitride ($SiO_xN_y$), and an aluminum oxide ($AlO_x$). In an embodiment, the first gate insulating layer GI1 may include an organic material.

The first gate electrode GAT1 may be disposed on the first gate insulating layer GI1. The first gate electrode GAT1 may be disposed to overlap the channel region of the first semiconductor pattern SCL1.

A driving voltage wire DVL may be disposed on the first gate insulating layer GI1. Here, the driving voltage wire DVL may correspond to a part of the second power line PL2 of FIG. 5 described above. The driving voltage wire DVL may be physically and/or electrically connected to a bridge electrode BRD through a second contact hole CH2. Since the bridge electrode BRD may be physically and/or electrically connected to the second electrode EL2, the driving voltage wire DVL may transmit a voltage of the second driving power source VS S (see FIG. 5) to the second electrode EL2 through the bridge electrode BRD. The driving voltage wire DVL is shown to be disposed on a same layer as the first gate electrode GAT1, but the disclosure is not limited thereto.

The second gate insulating layer GI2 may be disposed on the first gate electrode GAT1 and the first gate insulating layer GI1. The second gate insulating layer GI2 covers or overlaps the first gate electrode GAT1 and the first gate insulating layer GI1.

The second gate insulating layer GI2 may include a same material or a similar material as the first gate insulating layer GI1, and for example, it may include at least one of a silicon nitride ($SiN_x$), a silicon oxide ($SiO_x$), a silicon oxynitride ($SiO_xN_y$), and an aluminum oxide ($AlO_x$).

The second gate electrode GAT2 may be disposed on the second gate insulating layer GI2. The second gate electrode GAT2 may be disposed to overlap the first gate electrode GAT1. Accordingly, the first gate electrode GAT1 and the second gate electrode GAT2 overlapping each other with the second gate insulating layer GI2 therebetween may form one capacitor.

The interlayer insulating layer ILD may be disposed on the second gate insulating layer GI2. The interlayer insulating layer ILD covers or overlaps the second gate insulating layer GI2. The interlayer insulating layer ILD may include the same material or a similar material as the second gate insulating layer GI2, and may include an inorganic material or an organic material.

The first source electrode S1 and the first drain electrode D1 may be disposed on the interlayer insulating layer ILD. Here, the first source electrode S1 may have the same configuration as the first terminal of the first transistor T1 of FIG. 5 described above, and the first drain electrode D1 may have the same configuration as the second terminal of the first transistor T1.

The first drain electrode D1 may be electrically connected to the first electrode EL1 of the display element layer DPL through a passivation layer PSV to be described later and a first contact hole CH1 of the second via layer VIA2. Accordingly, the first transistor T1 may transmit a voltage of the first driving power source VDD (see FIG. 5) to the first electrode EL1.

The first via layer VIA1 may be disposed on the interlayer insulating layer ILD. The first via layer VIA1 covers or overlaps a part of the interlayer insulating layer ILD. Here, the first via layer VIA1 may be referred to as a dam structure partitioning a light emitting area, a pixel defining film, and a bank.

The first via layer VIA1 may include at least one organic insulating layer. The first via layer VIA1 may be a single film or a multi-film, and may include an inorganic insulating material and an organic insulating material. For example, the first via layer VIA1 may include at least one of a polyacrylates resin, an epoxy resin, a phenolic resin, a polyamides resin, and a polyimides resin.

The bridge electrode BRD may be disposed on the interlayer insulating layer ILD and the first via layer VIAL The bridge electrode BRD may be disposed to be bent in a third direction DR3 along a shape of the first via layer VIAL The bridge electrode BRD may be physically and/or electrically connected to the driving voltage wire DVL through the second contact hole CH2 of the second gate insulating layer GI2 and the interlayer insulating layer ILD. The bridge electrode BRD is shown to be disposed on a same layer as the first source electrode S1 and the first drain electrode D1 of the first transistor T1, but the disclosure is not limited thereto.

The passivation layer PSV may be disposed on the first source electrode S1, the first drain electrode D1, the interlayer insulating layer ILD, and the bridge electrode BRD. The passivation layer PSV may entirely cover or overlap the first source electrode S1 and the first drain electrode D1, and may partially cover or overlap the interlayer insulating layer ILD and the bridge electrode BRD.

The passivation layer PSV may include an organic insulating film, an inorganic insulating film, or the organic insulating film disposed on the inorganic insulating film. For example, the inorganic insulating film may include at least one of metal oxides such as a silicon oxide ($SiO_x$), a silicon nitride ($SiN_x$), a silicon oxynitride ($SiO_xN_y$), and an aluminum oxide ($AlO_x$). For example, the organic insulating film may include at least one of a polyacrylates resin, an epoxy resin, a phenolic resin, a polyamides resin, a polyimides rein, an unsaturated polyesters resin, a poly-phenylen ethers resin, a poly-phenylene sulfides resin, and a benzocyclobutene resin.

The second via layer VIA2 may be disposed on the passivation layer PSV and the bridge electrode BRD. The second via layer VIA2 may partially cover or overlap the passivation layer PSV and the bridge electrode BRD to have at least one opening OP. For example, in the opening OP of the second via layer VIA2 partially exposing an upper surface of the bridge electrode BRD, the second electrode EL2 and the bridge electrode BRD may be physically and/or electrically connected. Here, the second via layer VIA2 may be referred to as a dam structure partitioning a light emitting area together with the first via layer VIA1, a pixel defining film, and a bank.

A part of the second via layer VIA2 may be disposed on the display element layer DPL according to a height of the upper surface of the second via layer VIA2 formed along the third direction DR3. The second electrode EL2 may be disposed on the upper surface of the second via layer VIA2 disposed on the display element layer DPL.

The second via layer VIA2 may include at least one organic insulating layer. The second via layer VIA2 may be a single film or a multi-film, and may include an inorganic insulating material and an organic insulating material. For example, the second via layer VIA2 may include at least one of a polyacrylates resin, an epoxy resin, a phenolic resin, a polyamides resin, and a polyimides resin.

The display element layer DPL may include the first electrode EL1, a bonding electrode CP, the light emitting elements LD, a protective layer PVX, and the second electrode EL2.

The first electrode EL1 may be disposed on the second via layer VIA2. For example, the first electrode EL1 may be disposed on the pixel circuit layer PCL.

The first electrode EL1 may be electrically connected to the first end EP1 of each of the light emitting elements LD. The first electrode EL1 may be electrically connected to the first transistor T1 of the pixel circuit layer PCL through the first contact hole CH1. Here, the first electrode EL1 may be an anode.

The first electrode EL1 may include a transparent conductive material having a reflectivity. For example, the first electrode EL1 may include a conductive oxide such as an indium tin oxide (ITO), an indium zinc oxide (IZO), a zinc oxide (ZnO), an indium gallium zinc oxide (IGZO), or an indium tin zinc oxide (ITZO), and a conductive polymer such as poly(3,4-ethylenedioxythiophene (PEDOT). The first electrode EL1 may include an opaque metal advantageous for reflecting light emitted from the light emitting elements LD in the image display direction (for example, third direction DR3) of the display device. For example, the first electrode EL1 may further include metals such as magnesium (Mg), aluminum (Al), platinum (Pt), palladium (Pd), nickel (Ni), neodymium (Nd), iridium (Ir), chromium (Cr), titanium (Ti), molybdenum (Mo), and an alloy thereof.

The bonding electrode CP may be disposed on the first electrode EL1, and is a part bonded to the light emitting elements LD. The bonding electrode CP may be disposed between the first electrode EL1 and the light emitting element LD, and may be electrically connected to the first electrode EL1 and the light emitting element LD. For example, the bonding electrode CP may contact or directly contact the first end EP1 of the light emitting element LD to electrically connect the first electrode EL1 and the first end EP1 of the light emitting element LD.

The bonding electrode CP may be used as a reflective member for guiding light emitted from the light emitting elements LD in the image display direction (for example, third direction DR3) of the display device. To this end, the bonding electrode CP may be made of an opaque conductive material having a reflectivity. The bonding electrode CP may include the same material or a similar material as the first electrode EL1, or may include one or more selected from materials for example as the constituent material of the first electrode EL1. For example, the bonding electrode CP may include a metal such as copper (Cu), gold (Au), tin (Sn), and an alloy thereof capable of bonding to the light emitting element LD.

The light emitting element LD may be disposed on the bonding electrode CP. The first end EP1 of the light emitting element LD may be disposed on the bonding electrode CP, and the first end EP1 of the light emitting element LD may be physically and/or electrically connected to the bonding electrode CP.

The first end EP1 of the light emitting element LD may be disposed toward the bonding electrode CP, and the second end EP2 of the light emitting element LD may be disposed toward the second electrode EL2.

The light emitting element LD may be disposed between the bonding electrode CP and the second electrode EL2 in the height h direction of the light emitting element LD. The light emitting element LD shown in FIG. 8 may correspond to the light emitting element LD of FIG. 6 and FIG. 7 described above. In FIG. 8, in order to briefly illustrate the light emitting element LD, it is illustrated that the diameter of the first end EP1 and the diameter of the second end EP2 are the same.

An insulating film surrounding the surface of the light emitting element LD except for the first end EP1 and the second end EP2 may be further disposed on the side surface of the light emitting element LD. Due to the insulating film, the light emitting element LD may be more stably fixed on the bonding electrode CP.

The protective layer PVX may be disposed on parts of the second via layer VIA2, the first electrode EL1, the bonding electrode CP, and the light emitting element LD. The protective layer PVX may be disposed to cover or overlap a part of the upper surface of the second via layer VIA2 and to entirely cover or overlap the first electrode EL1 and the bonding electrode CP. The protective layer PVX may be disposed between the light emitting elements LD so that the second end EP2 of the light emitting element LD is exposed.

The protective layer PVX may include an inorganic insulating film including an inorganic material or an organic insulating film including an organic material. In an embodiment, the protective layer PVX may be utilized as a planarization layer for reducing a step due to components disposed thereunder in the display element layer (DPL). To this end, the protective layer PVX may be formed of an organic insulating film including an organic material.

The second electrode EL2 may be disposed on the light emitting element LD, the protective layer (PVX), and the second via layer VIA2. The second electrode EL2 may be disposed to cover or overlap the light emitting element LD, the protective layer PVX, and the second via layer VIA2. The second electrode EL2 may be disposed to cover or overlap a part of the upper surface of the passivation layer PSV.

The second electrode EL2 may include a transparent conductive material having a reflectivity. For example, the second electrode EL2 may include a conductive oxide such as an indium tin oxide (ITO), an indium zinc oxide (IZO), a zinc oxide (ZnO), an indium gallium zinc oxide (IGZO), or an indium tin zinc oxide (ITZO), and a conductive polymer such as poly(3,4-ethylenedioxythiophene (PEDOT). However, the material of the second electrode EL2 is not limited by the above description.

The second electrode EL2 may cover or overlap a part of the upper surface of the bridge electrode BRD exposed by the opening OP of the second via layer VIA2. A part of the upper surface of the bridge electrode BRD exposed by the opening OP of the second via layer VIA2 and the second electrode EL2 may be physically and/or electrically connected. The second electrode EL2 may be physically and/or electrically connected to the second end EP2 of the light emitting element LD exposed by the protective layer PVX. Accordingly, the voltage of the second driving power source VSS (see FIG. 5) provided through the bridge electrode BRD may be transmitted to the second end EP2 of the light emitting element LD. Here, the second electrode EL2 may be a cathode.

The second electrode EL2 may be disposed to entirely cover or overlap the upper surface of the display element layer DPL. Accordingly, in case that an electrical short circuit occurs between the light emitting element LD and the second electrode EL2 (or between the light emitting element LD and the first electrode EL1), a dark spot defect in which the entire pixel PXL does not emit light may occur. The display device may repair the defective pixel through a process (for example, laser cutting process) of partially opening the second electrode EL2 overlapping a short-circuited light emitting element LD. However, as a partial area of the second electrode is cut in the process of repairing the defective pixel, risks such as welding and residue may occur in a part adjacent to the cut second electrode.

In the display device, a bright spot defect may occur due to a defect in some or a number of or a part of the constituent elements of the pixel circuit layer PCL or an inflow of foreign particles. The bright spot defect is a defect in which one pixel emits white light as a whole. As a partial area of the second electrode is cut in the process of repairing the defective pixel, risks such as welding and residue may occur in a part adjacent to the cut second electrode.

Therefore, the display device according to an embodiment may minimize the repair risk by realizing the second electrode in various shapes in order to improve the dark spot defect or the bright spot defect of the pixel.

Hereinafter, a display device according to an embodiment will be described with reference to FIG. 9 to FIG. 15.

FIG. 9 to FIG. 15 illustrate schematic top plan views of a display device according to an embodiment.

Referring to FIG. 9 to FIG. 15, the first electrode EL1, the second electrode EL2, and the light emitting element LD that form the display element layer DPL of the display device according to an embodiment are shown. Here, the first electrode EL1 may be an anode, and the second electrode EL2 may be a cathode.

One pixel PXL may include a first sub-pixel PXL1, a second sub-pixel PXL2, and a third sub-pixel PXL3. The first sub-pixel PXL1, the second sub-pixel PXL2, and the third sub-pixel PXL3 may be disposed adjacent to each other side by side in a first direction DR1 (or transverse direction, horizontal direction).

Each of the first to third sub-pixel PXL1, PXL2, and PXL3 may include the first electrode EL1, the second electrode EL2, and the light emitting elements LD.

Each of the first to third sub-pixels PXL1, PXL2, and PXL3 may include a light emitting area EMA and a non-light emitting area NEA. The light emitting area EMA is an area in which the light emitting elements LD may be disposed, and the non-light emitting area NEA is an area surrounding the light emitting area EMA. The light emitting area EMA is an area from which light is emitted by the light emitting elements LD, and the non-light emitting area NEA is an area from which light is not emitted. Although not shown, a protective layer, a dam structure, a bank, a pixel defining film, and the like may be disposed in the non-light emitting area NEA.

The first electrode EL1 may be disposed on the base layer BSL, and extends in a second direction DR2. The first electrode EL1 may be disposed in the light emitting area EMA and the non-light emitting area NEA.

The light emitting elements LD may be disposed in the light emitting area EMA to overlap the first electrode EL1. Although not shown in the drawing, the bonding electrode CP (see FIG. 8) may be disposed between the light emitting element LD and the first electrode EL1.

The light emitting elements LD may be arranged or disposed on the first electrode EL1 in a given number and position. The light emitting elements LD may be arranged or disposed on the first electrode EL1 in various numbers and in various positions according to an embodiment.

Figure 9:
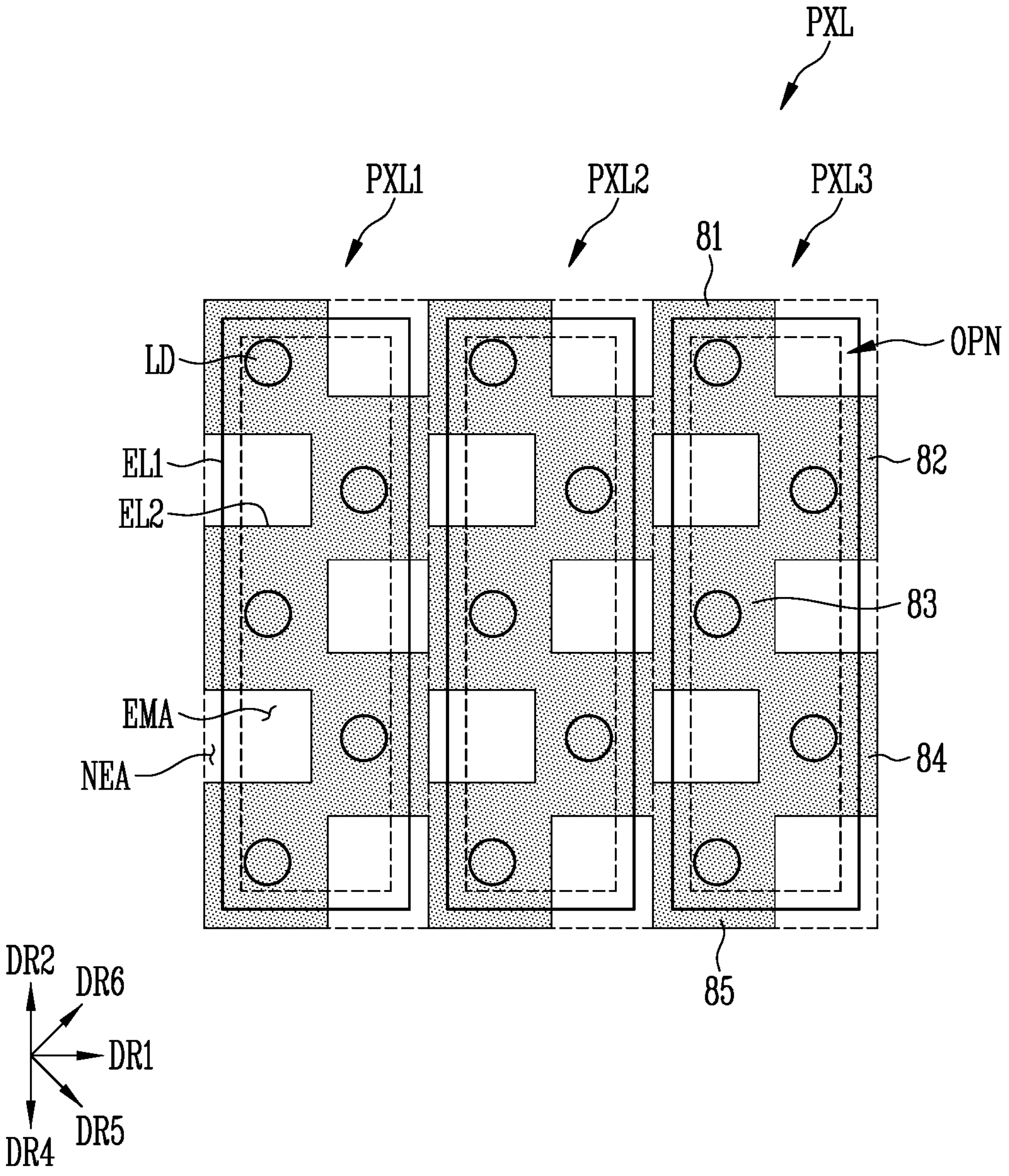
FIG. 9 to FIG. 15 illustrate schematic top plan views of a display device according to an embodiment.
Figure 12:
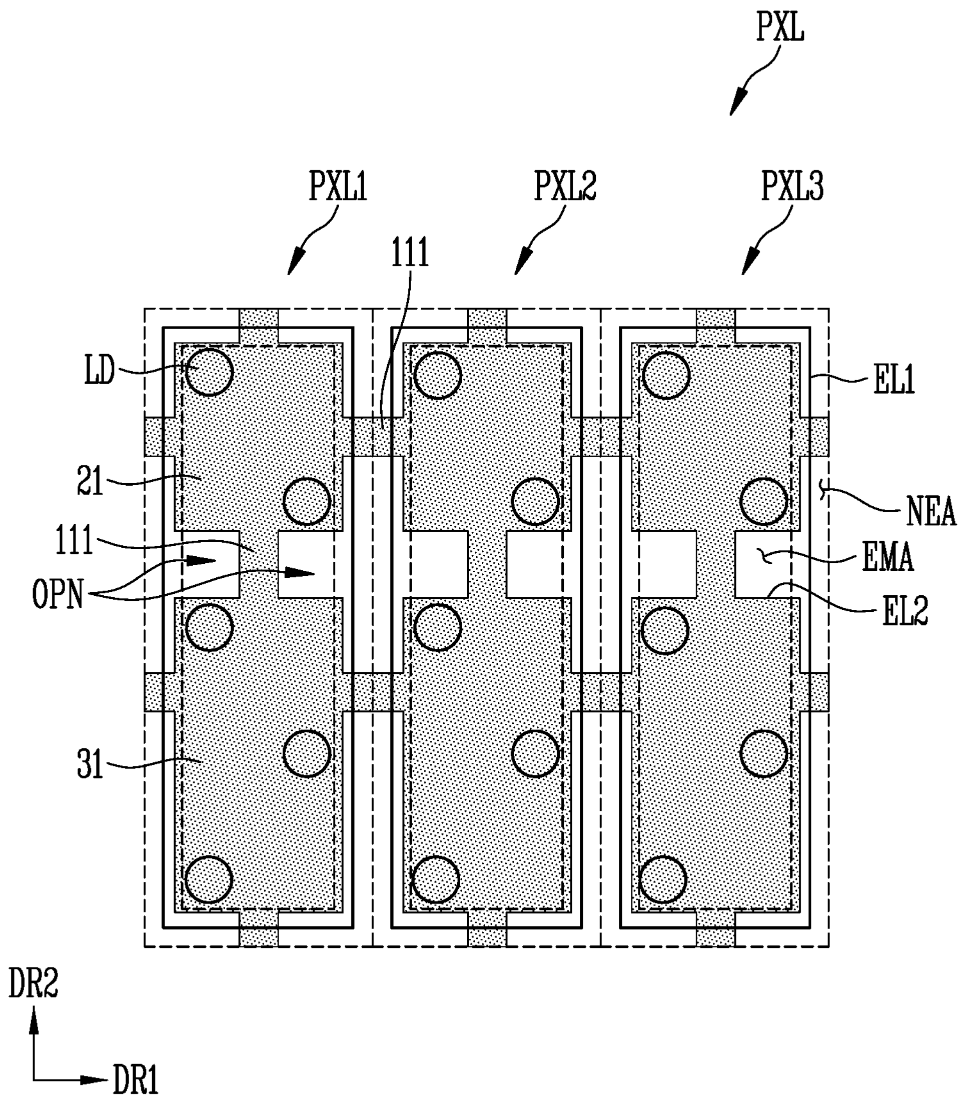

For example, as shown in FIG. 9 and FIG. 12, five light emitting elements LD may be disposed in each of the sub-pixels PXL1, PXL2, and PXL3, and the five light emitting elements LD may be spaced apart from each other and disposed in a substantially zigzag shape along the second direction DR2.

Figure 10:
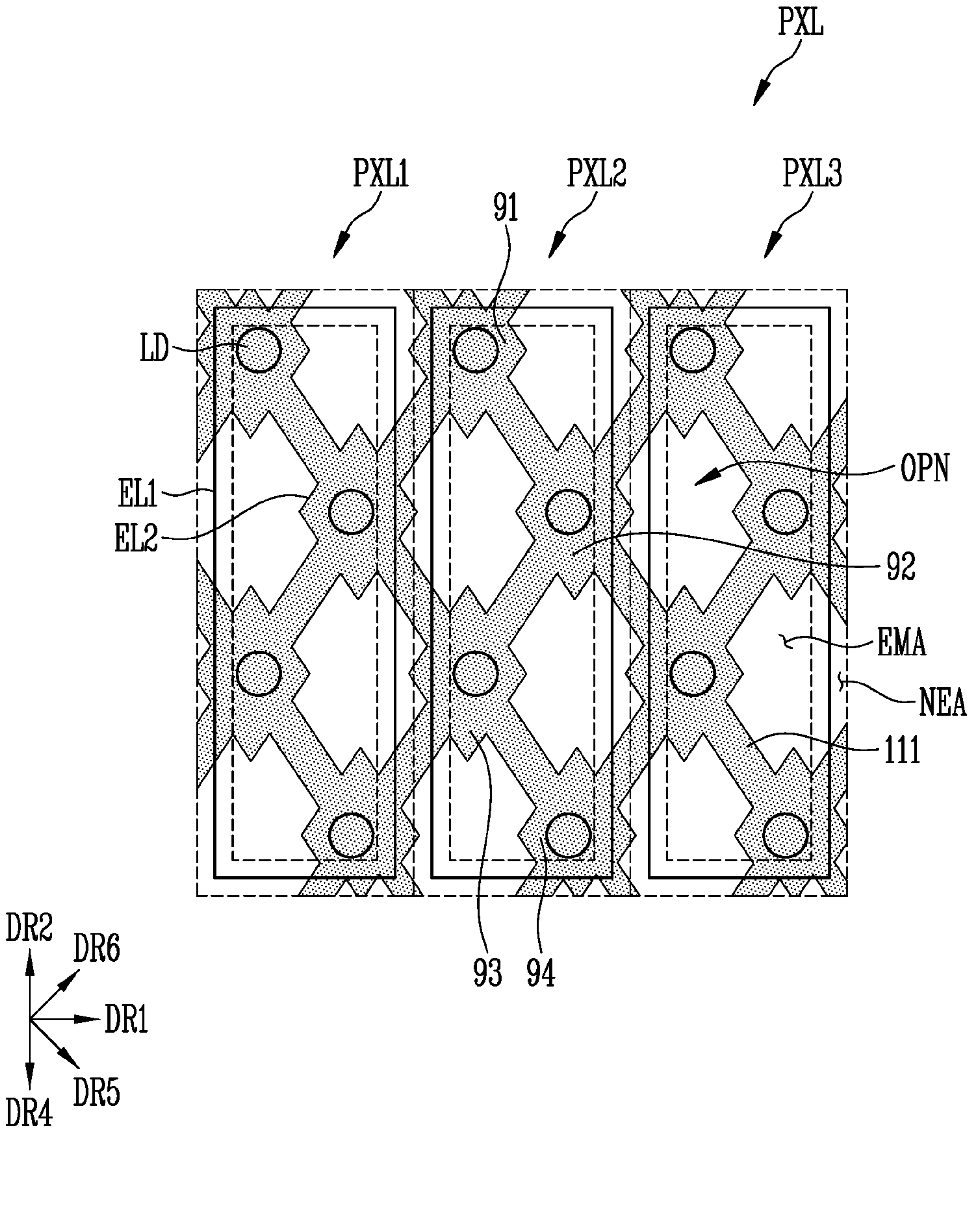
Figure 11:
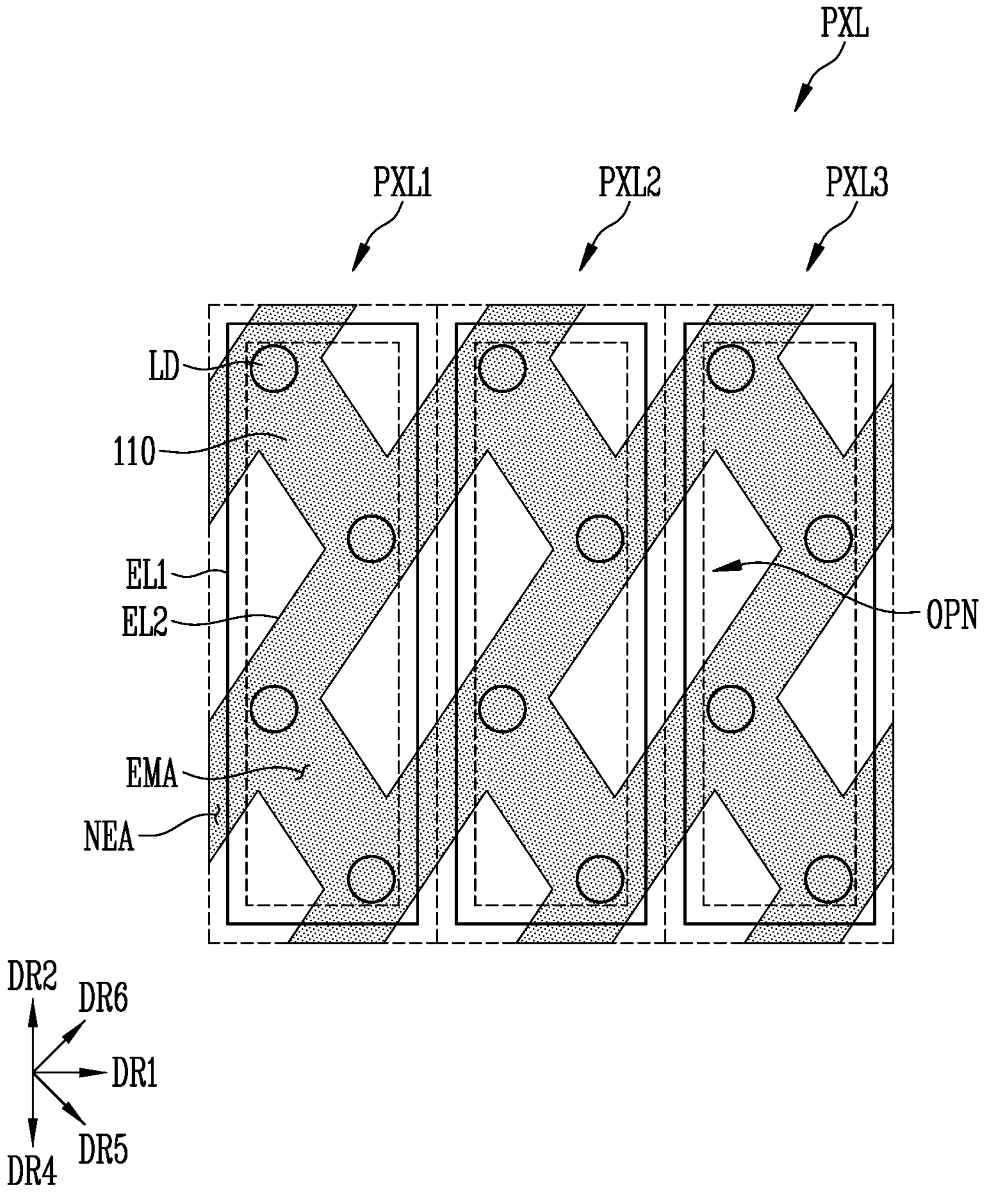
Figure 13:
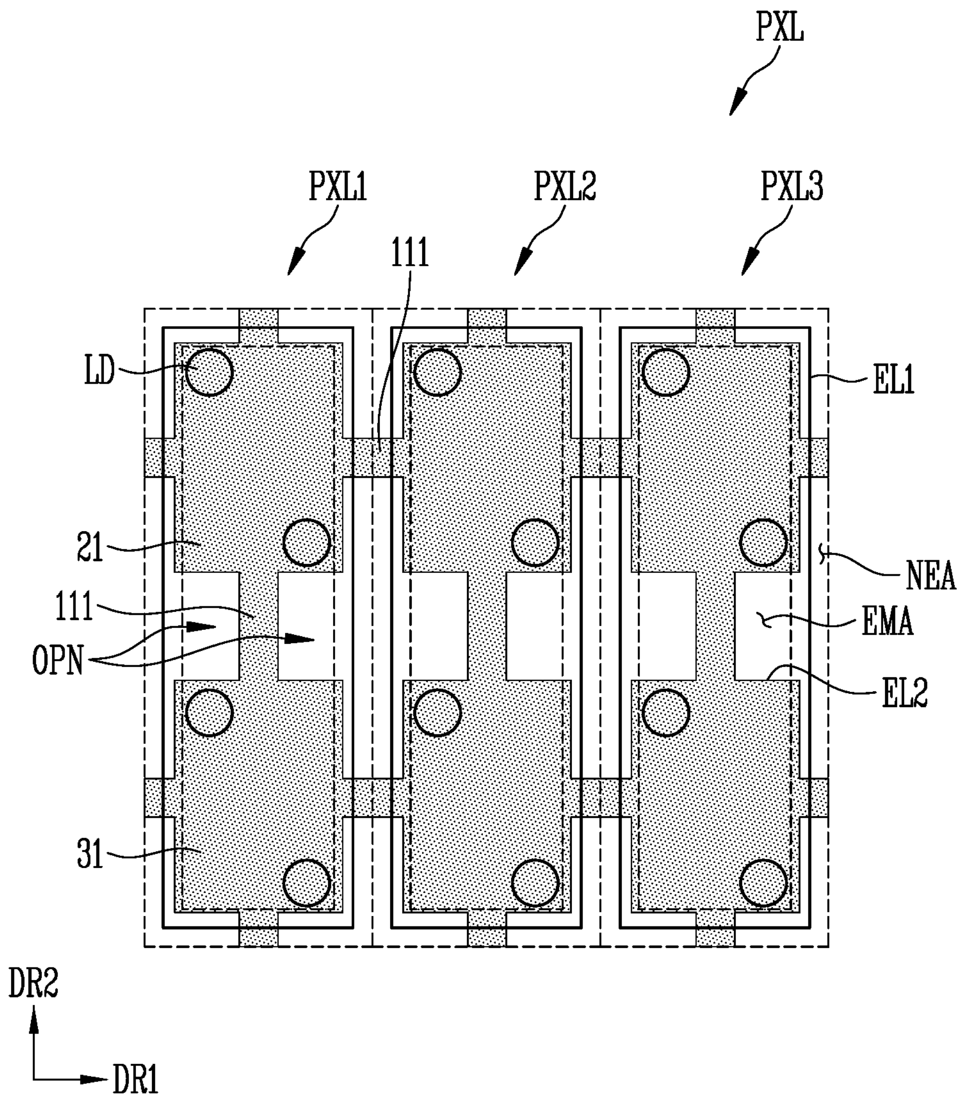

As shown in FIG. 10, FIG. 11, and FIG. 13, four light emitting elements LD may be disposed in each of the sub-pixels PXL1, PXL2, and PXL3, and the four light emitting elements LD may be spaced apart from each other and disposed in a substantially zigzag shape along the second direction DR2.

Figure 14:
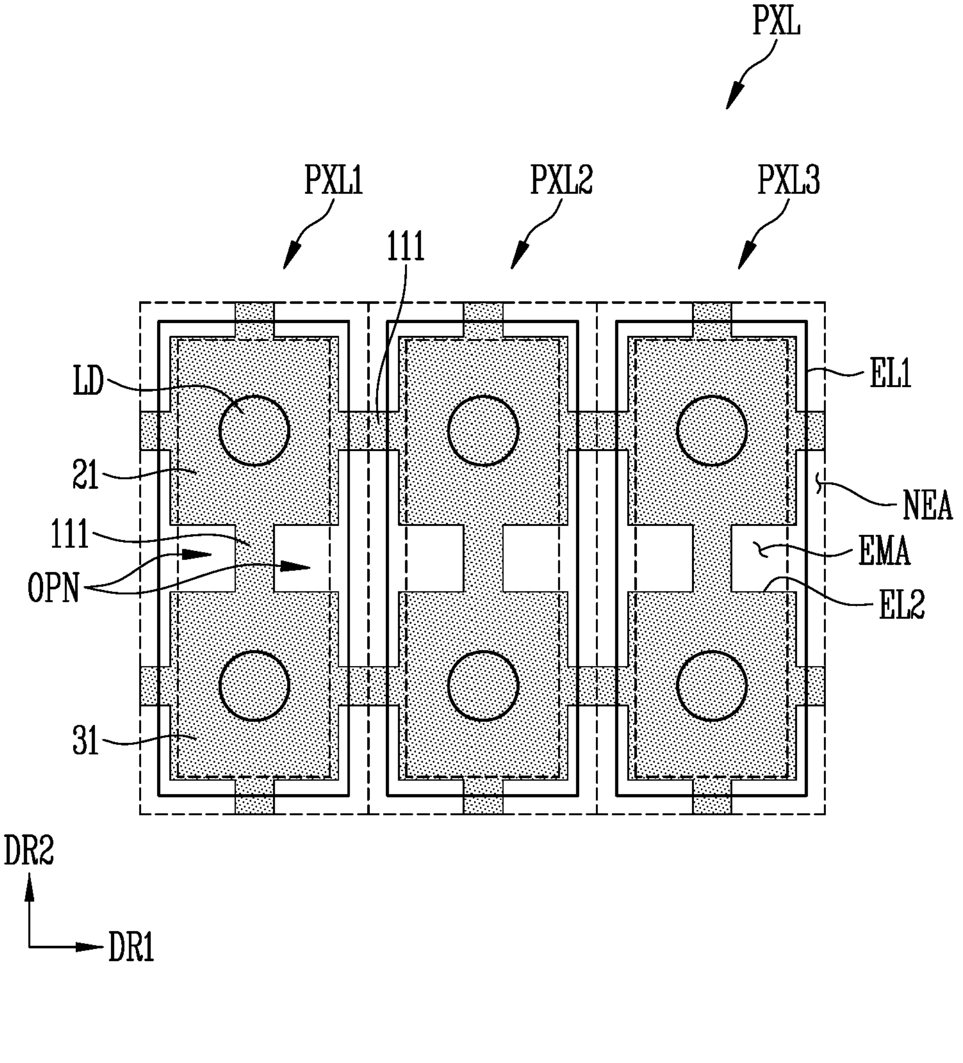

As shown in FIG. 14, two light emitting elements LD may be disposed in each of the sub-pixels PXL1, PXL2, and PXL3, and the two light emitting elements LD may be spaced apart from each other and disposed along the second direction DR2.

Figure 15:
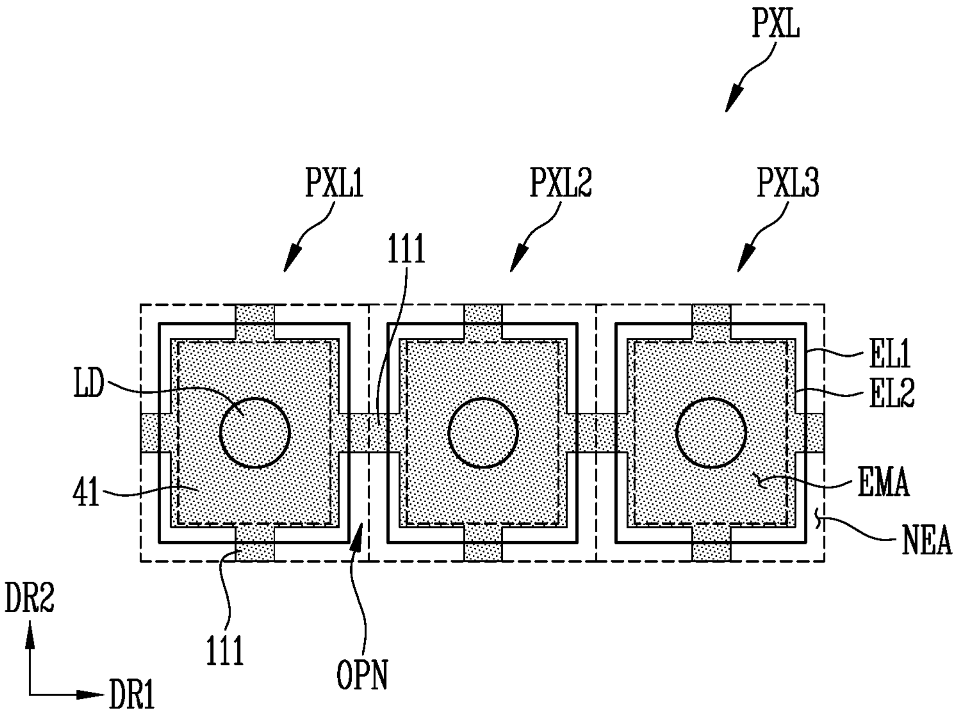

As shown in FIG. 15, only one light emitting element LD may be dispose in each of the sub-pixel PXL1, PXL2, and PXL3.

The second electrode EL2 may be entirely disposed in the pixel PXL throughout the light emitting area EMA and the non-light emitting area NEA.

The second electrode EL2 may at least partially overlap the light emitting element LD. The second electrode EL2 may include at least one overlapping part overlapping the light emitting element LD and an opening OPN not overlapping the light emitting element LD. The overlapping part of the second electrode EL2 may be deformed according to the position, shape, and number of the light emitting elements LD. The overlapping part of the second electrode EL2 may have a structure in which only at least one overlapping light emitting element LD may be independently driven.

The second electrode EL2 may have a substantially mesh shape including at least one opening OPN.

Referring to FIG. 9, the second electrode EL2 may include a first overlapping part 81, a second overlapping part 82, a third overlapping part 83, a fourth overlapping part 84, a fifth overlapping part 85, and at least one opening OPN.

Each of the first overlapping part 81, the second overlapping part 82, the third overlapping part 83, the fourth overlapping part 84, and the fifth overlapping part 85 overlaps at least one light emitting element LD. For example, as shown in FIG. 9, each of the first overlapping part 81, the second overlapping part 82, the third overlapping part 83, the fourth overlapping part 84, and the fifth overlapping part 85 may overlap one light emitting element LD.

The opening OPN does not overlap the light emitting element LD.

The first overlapping part 81, the second overlapping part 82, the third overlapping part 83, the fourth overlapping part 84, and the fifth overlapping part 85 are parts extending from each other in the first direction DR1 and the second direction DR2 with the opening OPN interposed therebetween. All edges of each of the overlapping parts 81, 82, 83, 84, and 85 may be partially adjacent to the opening OPN.

The second overlapping part 82 is a part extending along a fifth direction DR5 (or a first diagonal direction), which is a diagonal direction between the first direction DR1 and a fourth direction DR4 in the first overlapping part 81, and the first overlapping part 81 and the second overlapping part 82 may share a part of an edge including a vertex.

The third overlapping part 83 is a part extending along a sixth direction DR6 (or a second diagonal direction), which is a diagonal direction between the first direction DR1 and the second direction DR2 in the second overlapping part 82, and the second overlapping part 82 and the third overlapping part 83 may share a part of an edge including a vertex. The third overlapping part 83 may be disposed to be spaced apart from the first overlapping part 81 with the opening OPN therebetween along the second direction DR2 (or vertical direction, longitudinal direction).

The fourth overlapping part 84 is a part extending from the third overlapping part 83 along the fifth direction DR5, and the third overlapping part 83 and the fourth overlapping part 84 may share a part of an edge including a vertex. The fourth overlapping part 84 may be disposed to be spaced apart from the second overlapping part 82 with the opening OPN therebetween along the second direction DR2.

The fifth overlapping part 85 is a part extending from the fourth overlapping part 84 along the sixth direction DR6, and the fourth overlapping part 84 and the fifth overlapping part 85 may share a part of an edge including a vertex. The fifth overlapping part 85 may be disposed to be spaced apart from the third overlapping part 83 with the opening OPN therebetween along the second direction DR2.

Respective overlapping parts 81, 82, 83, 84, and 85 of respective the sub-pixels PXL1, PXL2, and PXL3 may be parts extending from each other.

For example, the second overlapping part 82 of the first sub-pixel PXL1 is a part extending from the first overlapping part 81 of the second sub-pixel PXL2 along the sixth direction DR6, and is a part extending from the third overlapping part 83 of the second sub-pixel PXL2 along the fifth direction DR5.

The third overlapping part 83 of the third sub-pixel PXL3 is a part extending from the second overlapping part 82 of the second sub-pixel PXL2 along the fifth direction DR5, and is a part extending from the fourth overlapping part 84 of the second sub-pixel PXL2 along the sixth direction DR6.

Since the display device according to an embodiment may include the second electrode EL2 of a shape capable of independently driving only at least one light emitting element LD in one pixel PXL, even if a part of the second electrode EL2 is cut, light emission of the light emitting elements LD present in the remaining parts except for the light emitting element LD overlapping the cut part thereof is not affected.

Therefore, the display device according to an embodiment may minimize the repair risk in case that a dark spot defect or a bright spot defect of the pixel PXL occurs.

The first overlapping part 81, the second overlapping part 82, the third overlapping part 83, the fourth overlapping part 84, and the fifth overlapping part 85 may be implemented in various shapes that may extend from each other. For example, each of the overlapping parts 81, 82, 83, 84, and 85 may have a rectangular shape of the same size or a substantially rectangular shape. The disclosure is not limited thereto, and in an embodiment, each of the overlapping parts 81, 82, 83, 84, and 85 may have a shape substantially of a circle, a triangle, a square, a rhombus, or the like within the spirit and the scope of the disclosure. Respective overlapping parts 81, 82, 83, 84, and 85 may have a different size and/or shape.

The shape, size, and position of each of the overlapping parts 81, 82, 83, 84, 85 may be variously changed according to the number and/or alignment position of the light emitting elements LD.

In the display device according to an embodiment, in case that a dark spot defect and/or a bright spot defect of the pixel PXL occurs, a repairing method of the second electrode EL2 will be described later with reference to FIG. 16.

Referring to FIG. 10, the second electrode EL2 may include a first overlapping part 91, a second overlapping part 92, a third overlapping part 93, a fourth overlapping part 94, a bridge 111, and at least one opening OPN.

Each of the first overlapping part 91, the second overlapping part 92, the third overlapping part 93, and the fourth overlapping part 94 overlaps at least one light emitting element LD. For example, each of the first overlapping part 91, the second overlapping part 92, the third overlapping part 93, and the fourth overlapping part 94 may overlap one light emitting element LD.

The bridge 111 may at least partially overlap the light emitting element LD, or may not overlap it.

The opening OPN does not overlap the light emitting element LD.

The first overlapping part 91, the second overlapping part 92, the third overlapping part 93, and the fourth overlapping part 94 are parts extending through the bridge 111 with the opening OPN interposed therebetween in the first direction DR1 and the second direction DR2.

The second overlapping part 92 is a part extending along the fifth direction DR5 (or first diagonal direction) from the first overlapping part 91 through the bridge 111.

The third overlapping part 93 is a part extending along the sixth direction DR6 (or second diagonal direction) from the second overlapping part 92 through the bridge 111. The third overlapping part 93 may be disposed to be spaced apart from the first overlapping part 91 with the opening OPN therebetween along the second direction DR2.

The fourth overlapping part 94 is a part extending along the fifth direction DR5 from the third overlapping part 93 through the bridge 111. The fourth overlapping part 94 may be disposed to be spaced apart from the second overlapping part 92 with the opening OPN therebetween along the second direction DR2.

Respective overlapping parts 91, 92, 93, and 94 of respective the sub-pixels PXL1, PXL2, and PXL3 may be parts extending from each other.

For example, the second overlapping part 92 of the first sub-pixel PXL1 is a part extending from the first overlapping part 91 of the second sub-pixel PXL2 along the sixth direction DR6 through the bridge 111, and is a part extending from the third overlapping part 93 of the second sub-pixel PXL2 along the fifth direction DR5 through the bridge 111.

The second overlapping part 92 of the second sub-pixel PXL2 is a part extending from the third overlapping part 93 of the third sub-pixel PXL3 along the fifth direction DR5 through the bridge 111, and is a part extending from the first part 91 of the third sub-pixel PXL3 along the sixth direction DR6 through the bridge 111.

Since the display device according to an embodiment may include the second electrode EL2 of a shape capable of independently driving only at least one light emitting element LD in one pixel PXL, even if a part of the second electrode EL2 is cut, light emission of the light emitting elements LD present in the remaining parts except for the light emitting element LD overlapping the cut part thereof is not affected.

Therefore, the display device according to an embodiment may minimize the repair risk in case that a dark spot defect and/or a bright spot defect of the pixel PXL occurs.

The first overlapping part 91, the second overlapping part 92, the third overlapping part 93, and the fourth overlapping part 94 may be implemented in various shapes that may extend from each other. For example, respective overlapping parts 91, 92, 93, and 94 may have a substantially rhombus shape of the same size, and respective overlapping parts 91, 92, 93, and 94 may extend from each other through the bridge 111 having a substantially rectangular shape. The opening OPN may have a cross shape. The disclosure is not limited thereto, and in an embodiment, each of the overlapping parts 91, 92, 93, and 94 may have a shape such as substantially a circle, substantially a triangle, substantially a rectangle, or substantially a square. Respective overlapping parts 91, 92, 93, and 94 may have a different size and/or shape.

The shape, size, and position of each of the overlapping parts 91, 92, 93, and 94 may be variously changed according to the number and/or alignment position of the light emitting elements LD.

In the display device according to an embodiment, in case that a dark spot defect and/or a bright spot defect of the pixel PXL occurs, a repairing method of the second electrode EL2 will be described later with reference to FIG. 17.

Referring to FIG. 11, the second electrode EL2 may include a pattern part 110 and an opening OPN.

The pattern part 110 overlaps the light emitting elements LD. For example, the pattern part 110 may overlap four light emitting elements LD.

The pattern part 110 may be implemented in various shapes to be able to overlap the light emitting elements LD. For example, the pattern part 110 may have a zigzag polygonal shape extending in the fifth direction DR5 and the sixth direction DR6. The disclosure is not limited thereto, and in an embodiment, the pattern part 110 may have various shapes such as a wave shape.

A size and/or shape of the pattern part 110 may be variously changed according to the number and/or positions of the light emitting elements LD. For example, in case that the light emitting elements LD may be disposed in a zigzag pattern in the fifth direction DR5 and the sixth direction DR6, the pattern part 110 may have the same zigzag pattern to cover or overlap the light emitting elements LD. For example, the zigzag pattern of the pattern part 110 may have a wider width than the zigzag pattern according to the alignment of the light emitting elements LD.

The opening OPN does not overlap the light emitting element LD.

The opening OPN may be disposed between the pattern parts 110 of respective sub-pixels PXL1, PXL2, and PXL3. The opening OPN may have various shapes according to the shape of the pattern part 110. For example, the opening OPN may have a rhombus shape. The disclosure is not limited thereto, and in an embodiment, the opening OPN may have various shapes such as substantially an oval, substantially a rectangle, and the like within the spirit and the scope of the disclosure.

Since the display device according to an embodiment may include the second electrode EL2 of a shape capable of independently driving only at least one light emitting element LD in one pixel PXL, even if a part of the second electrode EL2 is cut, light emission of the light emitting elements LD present in the remaining parts except for the light emitting element LD overlapping the cut part thereof is not affected.

Therefore, the display device according to an embodiment may minimize the repair risk in case that a dark spot defect and/or a bright spot defect of the pixel PXL occurs.

In the display device according to an embodiment, in case that a dark spot defect and/or a bright spot defect of the pixel PXL occurs, a repairing method of the second electrode EL2 will be described later with reference to FIG. 18.

Referring to FIG. 12 to FIG. 14, the second electrode EL2 may include a first plate part 21, a second plate part 31, a bridge 111, and at least one opening OPN.

The first plate part 21 and the second plate part 31 overlap at least one light emitting element LD. For example, referring to FIG. 12, the first plate part 21 may overlap two light emitting elements LD, and the second plate part 31 may overlap three light emitting elements LD. Referring to FIG. 13, the first plate part 21 may overlap two light emitting elements LD, and the second plate part 31 may overlap two light emitting elements LD. Referring to FIG. 14, the first plate part 21 may overlap one light emitting element LD, and the second plate part 31 may overlap one light emitting element LD.

The first plate part 21 and the second plate part 31 may be disposed only in the light emitting area EMA, and the bridge 111 may be disposed only in the non-light emitting area NEA. The bridge 111 may not overlap the light emitting element LD.

The opening OPN does not overlap the light emitting element LD.

The first plate part 21 is a part extending from the second plate part 31 through the bridge 111 along the second direction DR2. At least one opening OPN may be disposed between the first plate 21 and the second plate 31.

The first plate part 21 and the second plate part 31 of each of the sub-pixel PXL1, PXL2, and PXL3 may be extended from each other.

For example, the first plate part 21 of the first sub-pixel PXL1 is a part extending from the first plate part 21 of the second sub-pixel PXL2 along the first direction DR1 through the bridge 111.

The second plate part 31 of the first sub-pixel PXL1 is a part extending from the second plate part 31 of the second sub-pixel PXL2 along the first direction DR1 through the bridge 111.

Since the display device according to an embodiment may include the second electrode EL2 of a shape capable of independently driving only at least one light emitting element LD in one pixel PXL, even if a part of the second electrode EL2 is cut, light emission of the light emitting elements LD present in the remaining parts except for the light emitting element LD overlapping the cut part thereof is not affected.

Therefore, the display device according to an embodiment may minimize the repair risk in case that a dark spot defect and/or a bright spot defect of the pixel PXL occurs.

Referring to FIG. 15, the second electrode EL2 may include a plate part 41, a bridge 111, and at least one opening OPN.

The plate part 41 overlaps one light emitting element LD. The bridge 111 may not overlap the light emitting element LD. The opening OPN does not overlap the light emitting element LD.

The plate parts 41 of respective sub-pixel PXL1, PXL2, and PXL3 may be extended from each other.

For example, the plate part 41 of the first sub-pixel PXL1 is a part extending from the plate part 41 of the second sub-pixel PXL2 along the first direction DR1 through the bridge 111.

Since the display device according to an embodiment may include the second electrode EL2 of a shape capable of independently driving only at least one light emitting element LD in one pixel PXL, even if a part of the second electrode EL2 is cut, light emission of the light emitting elements LD present in the remaining parts except for the light emitting element LD overlapping the cut part thereof is not affected.

Therefore, the display device according to an embodiment may minimize the repair risk in case that a dark spot defect and/or a bright spot defect of the pixel PXL occurs.

Hereinafter, in case that a dark spot defect and/or a bright spot defect of the pixel occurs, a repairing method of the second electrode will be described with reference to FIG. 16 to FIG. 19.

FIG. 16 to FIG. 19 are drawings for explaining a method of repairing a second electrode in a display device according to an embodiment.

Figure 16:
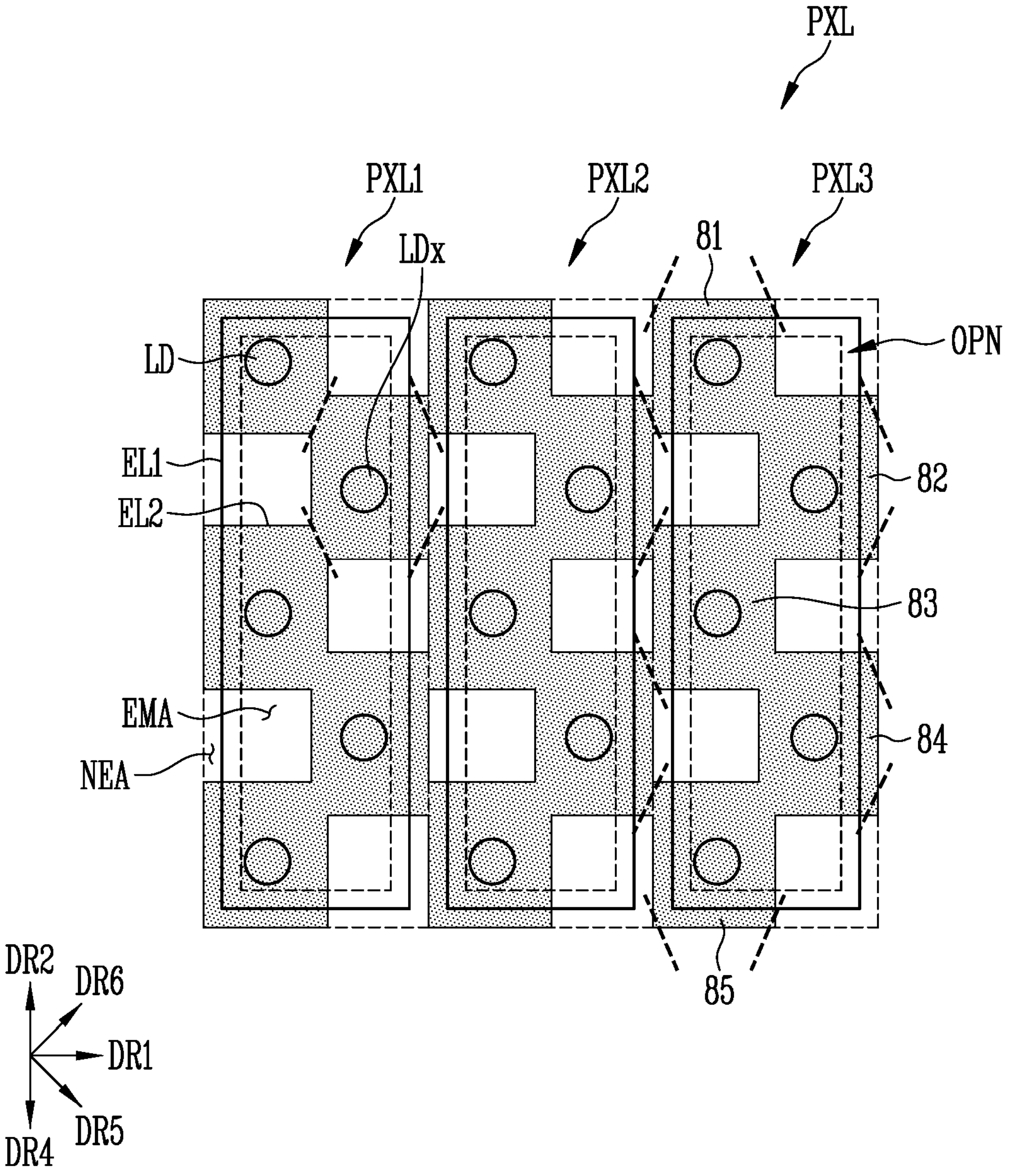
FIG. 16 to FIG. 19 are drawings for explaining a method of repairing a second electrode in a display device according to an embodiment.
Figure 17:
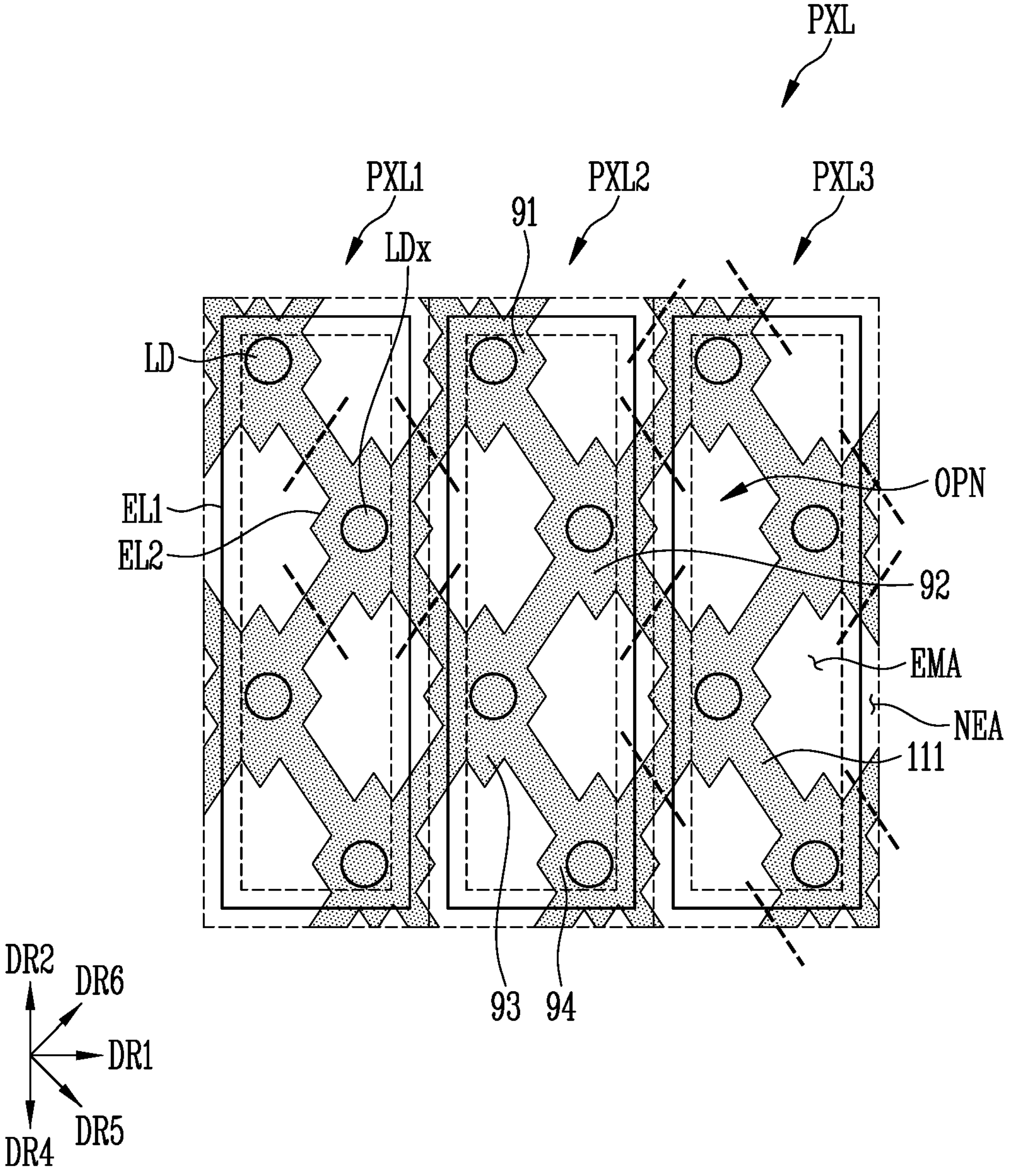
Figure 18:
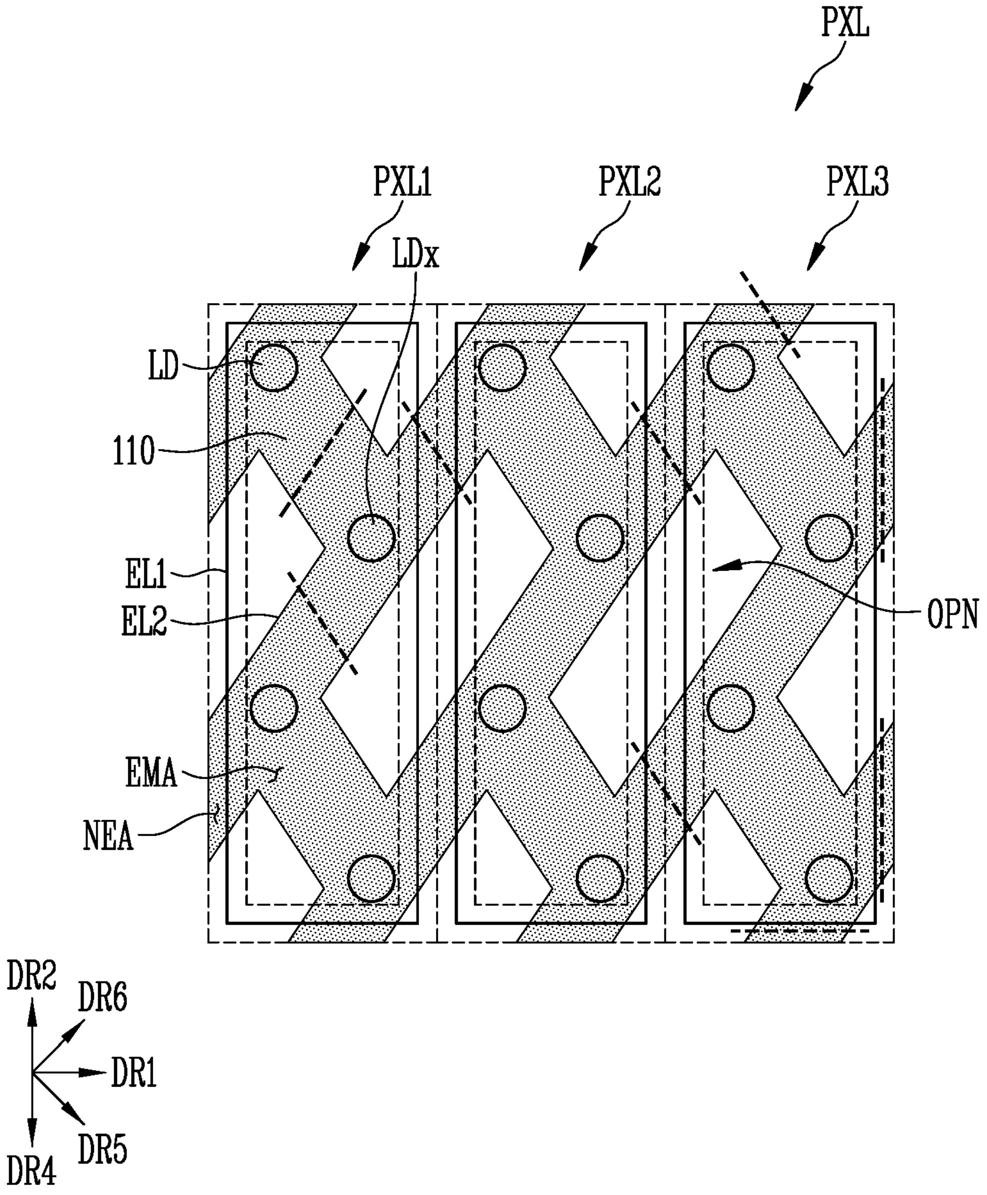
Figure 19:
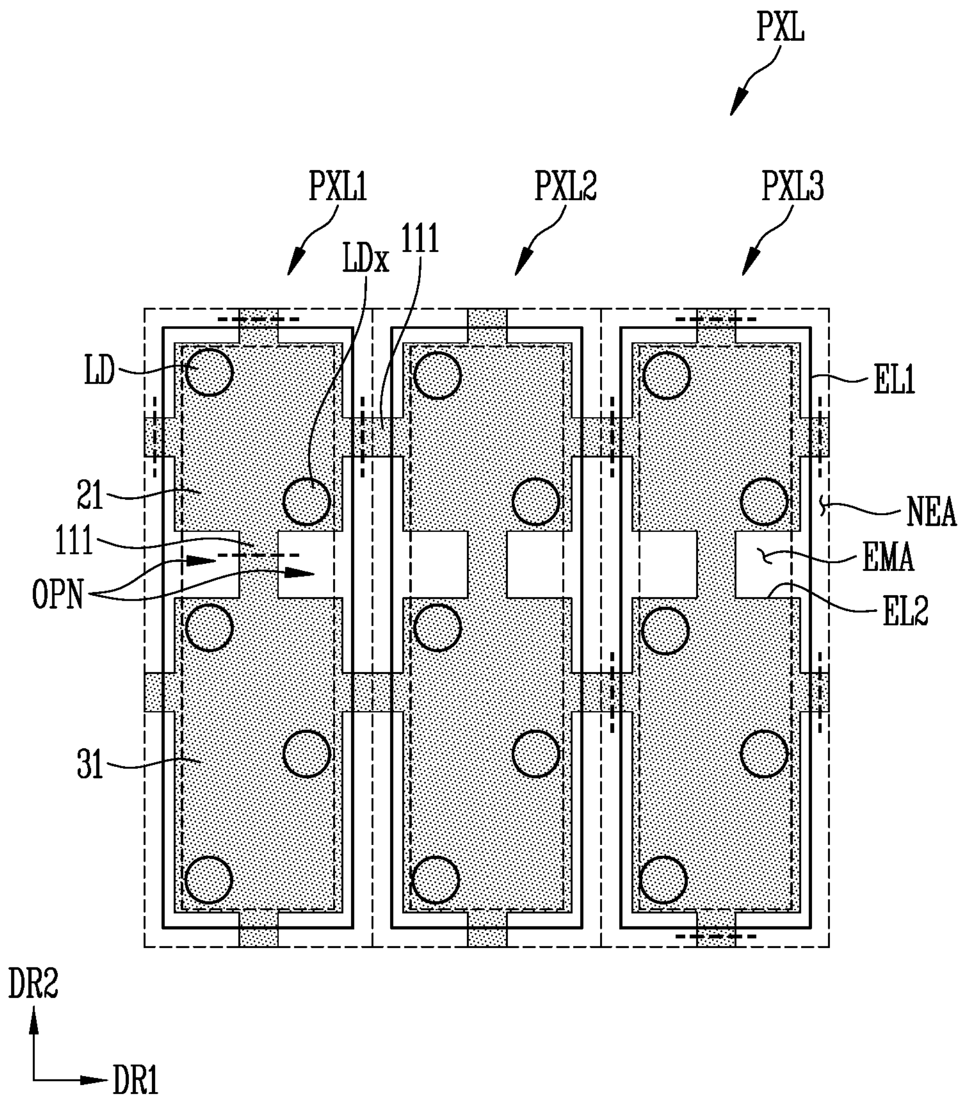

FIG. 16 illustrates the same as the configuration described in FIG. 9, FIG. 17 illustrates the same as the configuration described in FIG. 10, FIG. 18 illustrates the same as the configuration described in FIG. 11, and FIG. 19 illustrates the same as the configuration described in FIG. 12.

FIG. 16 to FIG. 19 illustrate methods for repairing the second electrode based on the display device described with reference to FIG. 9 to FIG. 12, so duplicate descriptions of the above will be omitted.

In FIG. 16 to FIG. 19, a laser-cut part of the second electrode EL2 is indicated by a dotted line.

In an embodiment, the second electrode EL2 may be repaired by laser cutting. For example, in case that a dark spot defect occurs in the pixel PXL, a part of the second electrode EL2 overlapping the light emitting element LD having the dark spot defect may be laser-cut. In case that a bright spot defect occurs in the pixel PXL, the second electrode EL2 overlapping the sub-pixel in which the bright spot defect occurs may be laser-cut.

In an embodiment, even if the second electrode EL2 in the part in which the dark spot defect and/or bright spot defect occurs is removed, since the other part of the second electrode EL2 may be connected by a mesh structure, a bridge structure, a pattern structure, or the like, the laser cutting area may be minimized. By minimizing the laser cutting area of the second electrode EL2, the risk of welding and residues in a part adjacent to the second electrode EL2 to be cut may be minimized.

Referring to FIG. 16, in case that a dark spot defect occurs in an x-th light emitting element LDx of the first sub-pixel PXL1, the second overlapping part 82 of the first sub-pixel PXL1 overlapping the x-th light emitting element LDx may be removed. Accordingly, laser cutting may be performed at a part of a corner including four vertices of the second overlapping part 82 of the first sub-pixel PXL1.

In case that a bright spot defect occurs in the third sub-pixel PXL3, the second electrode EL2 overlapping the third sub-pixel PXL3 may be removed. Accordingly, a part of a corner including a vertex part extending from the first overlapping part 81, the second overlapping part 82, the third overlapping part 83, the fourth overlapping part 84, and the fifth overlapping part 85 of the third sub-pixel PXL3 to another sub-pixel may be laser-cut.

Even in case that laser cutting is performed at points of the second electrode EL2, since a part of the cut second electrode EL2 is adjacent to the opening OPN, the risk of welding and residue on the remaining second electrode EL2 may be minimized.

Referring to FIG. 17, in case that a dark spot defect occurs in an x-th light emitting element LDx of the first sub-pixel PXL1, the second overlapping part 92 of the first sub-pixel PXL1 overlapping the x-th light emitting element LDx may be removed. Accordingly, laser cutting may be performed on the bridge 111 extending the second overlapping part 92 of the first sub-pixel PXL1 to another part.

In case that a bright spot defect occurs in the third sub-pixel PXL3, the second electrode EL2 overlapping the third sub-pixel PXL3 may be removed. Accordingly, the bridge 111 extending from the first overlapping part 91, the second overlapping part 92, the third overlapping part 93, and the fourth overlapping part 94 of the third sub-pixel PXL3 to another sub-pixel may be laser-cut.

Even in case that laser cutting is performed at points of the second electrode EL2, since a part of the cut second electrode EL2 is adjacent to the opening OPN, the risk of welding and residue on the remaining second electrode EL2 may be minimized.

Referring to FIG. 18, in case that a dark spot defect occurs in an x-th light emitting element LDx of the first sub-pixel PXL1, a part of the pattern part 110 of the first sub-pixel PXL1 overlapping the x-th light emitting element LDx may be removed. Accordingly, laser cutting may be performed at a part of the pattern part 110 of the first sub-pixel PXL1.

In case that a bright spot defect occurs in the third sub-pixel PXL3, the second electrode EL2 overlapping the third sub-pixel PXL3 may be removed. Accordingly, laser cutting may be performed at a part of the pattern part 110 extending from the pattern part 110 of the third sub-pixel PXL3 to another sub-pixel.

Even in case that laser cutting is performed at points of the second electrode EL2, since a part of the cut second electrode EL2 is adjacent to the opening OPN, the risk of welding and residue on the remaining second electrode EL2 may be minimized.

Referring to FIG. 19, in case that a dark spot defect occurs in an x-th light emitting element LDx of the first sub-pixel PXL1, the first plate part 21 of the first sub-pixel PXL1 overlapping the x-th light emitting element LDx may be removed. Accordingly, laser cutting may be performed on the bridges 111 extending from the first plate part 21 of the first sub-pixel PXL1 to another sub-pixel.

In case that a bright spot defect occurs in the third sub-pixel PXL3, the second electrode EL2 overlapping the third sub-pixel PXL3 may be removed. Accordingly, laser cutting may be performed on the bridges 111 extending from the first plate part 21 and the second plate part 31 of the third sub-pixel PXL3 to another sub-pixel.

Even in case that laser cutting is performed at points of the second electrode EL2, since a part of the cut second electrode EL2 is adjacent to the opening OPN, the risk of welding and residue on the remaining second electrode EL2 may be minimized.

Hereinafter, various embodiments to which the display device according to an embodiment may be applied will be described with reference to FIG. 20 to FIG. 23.

Figure 20:
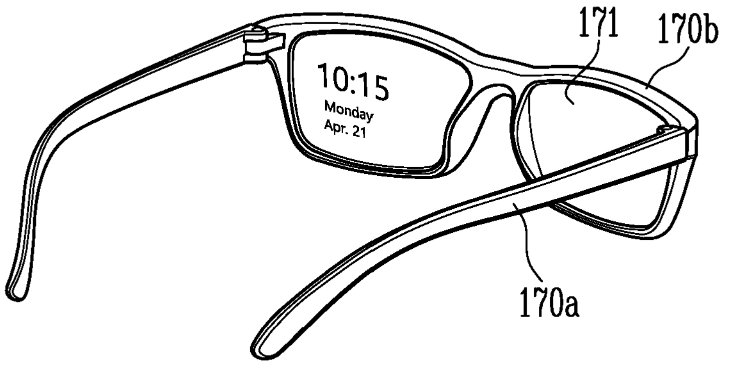
FIG. 20 is a drawing in which a display device according to an embodiment is applied to a smart glass.
Figure 21:
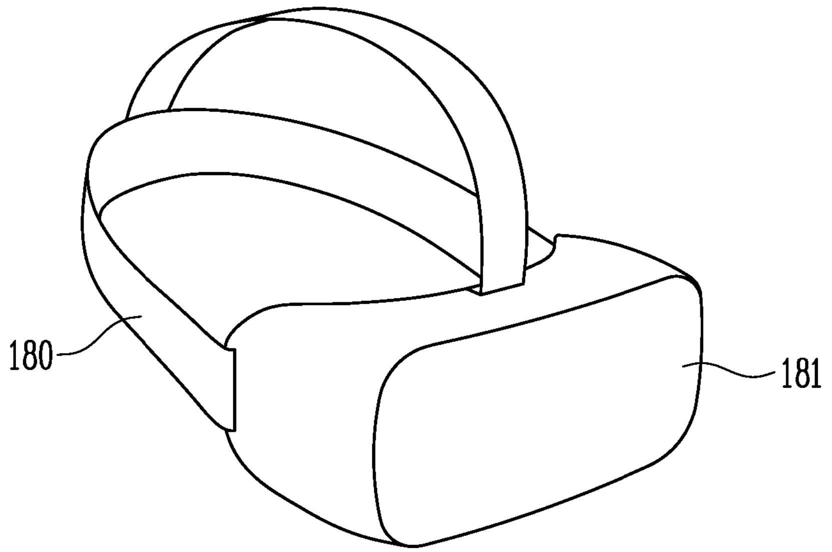
FIG. 21 is a drawing in which a display device according to an embodiment is applied to a head mounted display.
Figure 22:
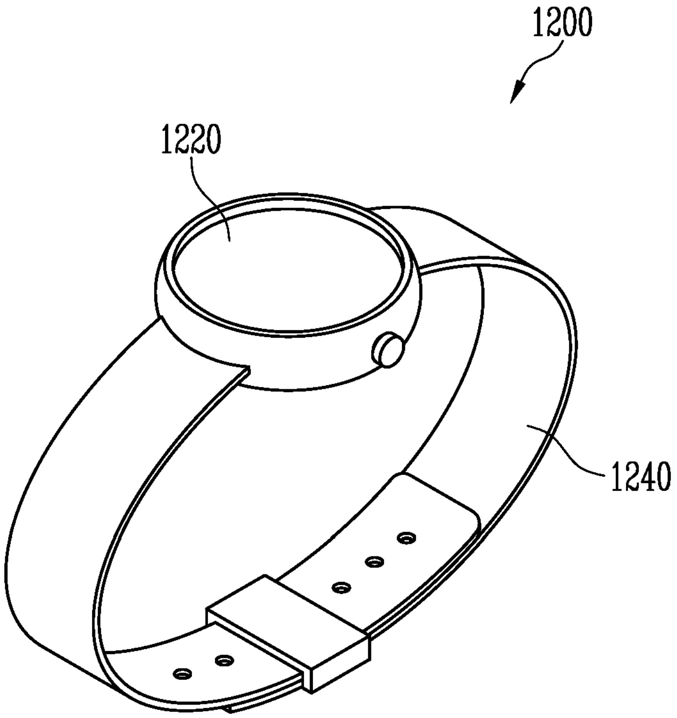
FIG. 22 is a drawing in which a display device according to an embodiment is applied to a smart watch.
Figure 23:
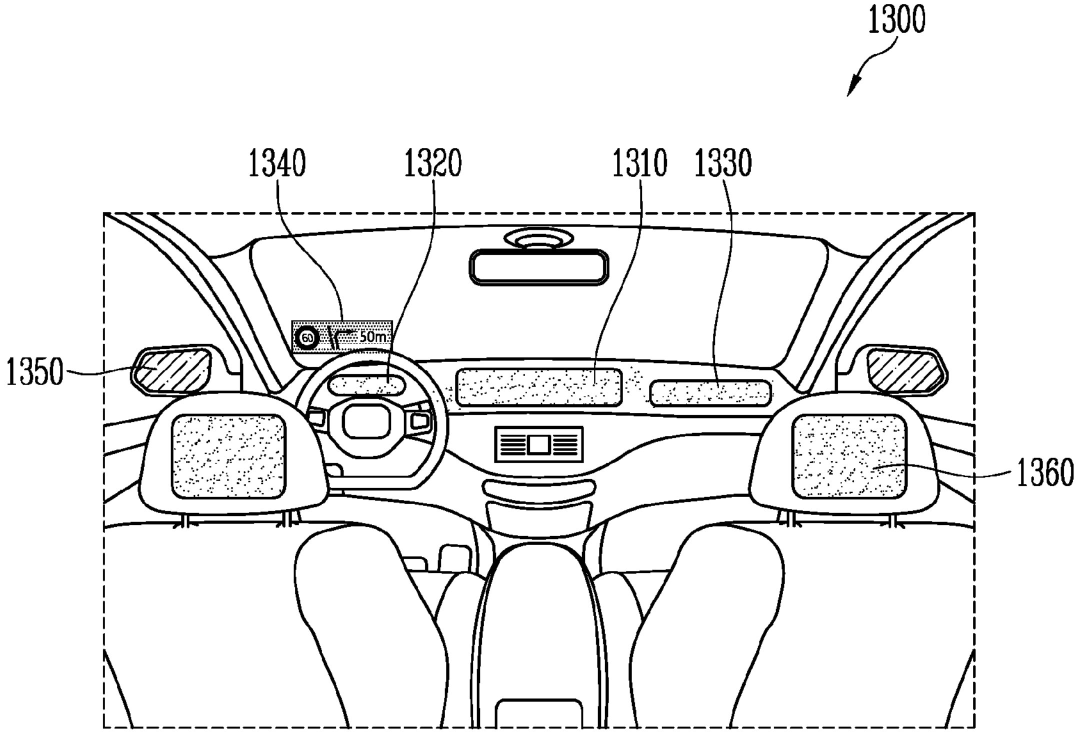
FIG. 23 is a drawing in which a display device according to an embodiment is applied to an automotive display.

FIG. 20 is a drawing in which a display device according to an embodiment is applied to a smart glass, FIG. 21 is a drawing in which a display device according to an embodiment is applied to a head mounted display, FIG. 22 is a drawing in which a display device according to an embodiment is applied to a smart watch, and FIG. 23 is a drawing in which a display device according to an embodiment is applied to an automotive display.

Referring to FIG. 20, the display device according to an embodiment may be applied to a smart glass including a frame 170 and a lens part 171. The smart glass is a wearable electronic device that may be worn on a user's face, and may have a structure in which a part of the frame 170 is folded or unfolded. For example, the smart glass may be a wearable device for augmented reality (AR).

The frame 170 may include a housing 170*b* supporting the lens part 171 and a leg part 170*a* for a user to wear. The leg part 170*a* may be connected or coupled to the housing 170*b* by a hinge to be folded or unfolded.

A battery, a touch pad, a microphone, and a camera may be embedded in the frame 170. A projector that outputs light and a processor that controls an optical signal and the like may be embedded in the frame 170.

The lens part 171 may be an optical member that transmits light or reflects light. The lens part 171 may include glass, a transparent synthetic resin, or the like within the spirit and the scope of the disclosure.

The lens part 171 may reflect an image by an optical signal transmitted from the projector of the frame 170 by a rear surface (for example, a surface of a direction directed to the user's eyes) of the lens part 171, so that it is possible to allow the user's eyes to recognize it. For example, the user may recognize information such as time and date displayed on the lens part 171 as shown in the drawing. For example, the lens part 171 may be a type of display device, and the display device according to the above-described embodiment may be applied to the lens part 171.

Referring to FIG. 21, the display device according to an embodiment may be applied to a head mounted display (HMD) including a head mounting band 180 and a display receiving case 181. The head mounted display is a wearable electronic device that may be worn on the user's head.

The head mounting band 180 may be connected to the display receiving case 181 to fix the display receiving case 181. In the drawing, the head mounting band 180 has been shown to surround an upper side of the user's head and both sides thereof, but the disclosure is not limited thereto. The head mounting band 180 is for fixing the head mounted display to the user's head, and may be formed in a form of a spectacle frame or a helmet.

The display receiving case 181 accommodates the display device, and may include at least one lens. The at least one lens is a part that provides an image to the user. For example, the display device according to an embodiment may be applied to a left eye lens and a right eye lens implemented in the display receiving case 181.

Referring to FIG. 22, the display device according to an embodiment may be applied to a smart watch 1200 including a display part 1220 and a strap part 1240.

The smart watch 1200 is a wearable electronic device, and may have a structure in which the strap part 1240 is mounted on a user's wrist. Here, the display device according to an embodiment is applied to the display part 1220, so that image data including time information may be provided to the user.

Referring to FIG. 23, the display device according to an embodiment may be applied to an automotive display 1300. Here, the automotive display 1300 may refer to an electronic device that may be provided inside and outside a vehicle to provide image data.

For example, the display device may be applied to at least one of an infotainment panel 1310, a cluster 1320, a co-driver display 1330, a head-up display 1340, a side mirror display 1350, and a rear-seat display 1360, which are provided in the vehicle.

Hereinafter, a display device according to an embodiment will be schematically described with reference to FIG. 24.

Figure 24:
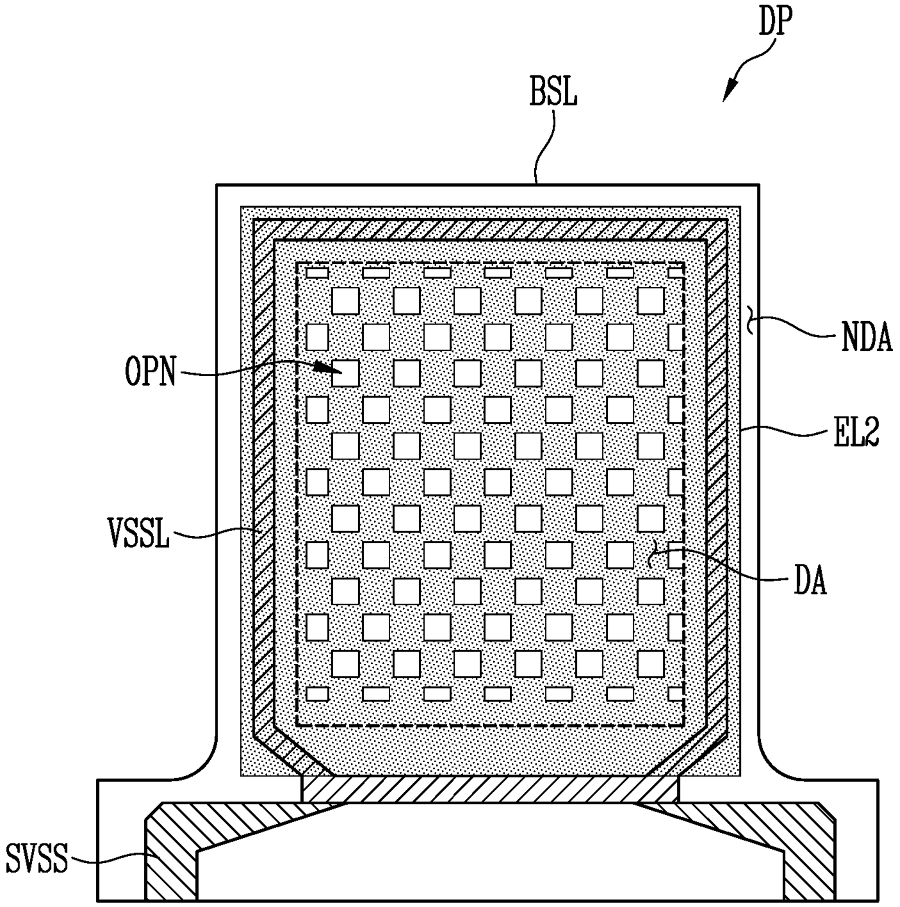
FIG. 24 illustrates a schematic top plan view of a display panel according to an embodiment.

FIG. 24 illustrates a schematic top plan view of a display panel according to an embodiment.

Referring to FIG. 24, the display panel DP according to an embodiment is implemented on the base layer BSL, and may include the display area DA for displaying an image and the non-display area NDA. The non-display area NDA is an area in which no image is displayed, and may be a bezel area surrounding the display area DA or adjacent to the display area DA.

A second driving power line VSSL and a second driving power supply line SVSS applying the second driving power source VSS (see FIG. 5) may be disposed in the non-display area NDA.

The second driving power line VSSL may be disposed on four sides of the non-display area NDA to surround the display area DA, and the second driving power supply line SVSS may be disposed at a lower part of the display panel DP and may be electrically connected to the second driving power line VSSL.

The second driving power supply line SVSS may be connected to a pad part to receive a voltage of the second driving power supply VSS, and may transmit it to the second driving power line VSSL. The second driving power line VSSL may transmit the second driving power VSS to the second electrode EL2 through the second power line PL2 (see FIG. 5).

The second electrode EL2 may be disposed in an entire area of the display panel DP to overlap the display area DA and the non-display area NDA.

The second electrode EL2 may include an overlapping part overlapping the light emitting element LD (see FIG. 5) and an opening OPN not overlapping the light emitting element LD. The overlapping part of the second electrode EL2 may be deformed according to the position, shape, and number of the light emitting elements LD. The overlapping part of the second electrode EL2 may have a structure in which only at least one overlapping light emitting element LD may be independently driven. Accordingly, the second electrode EL2 may have a substantially mesh shape in which overlapping parts and openings OPN may be sequentially disposed.

Hereinafter, a display device according to an embodiment will be described with reference to FIG. 25 to FIG. 27.

Figure 25:
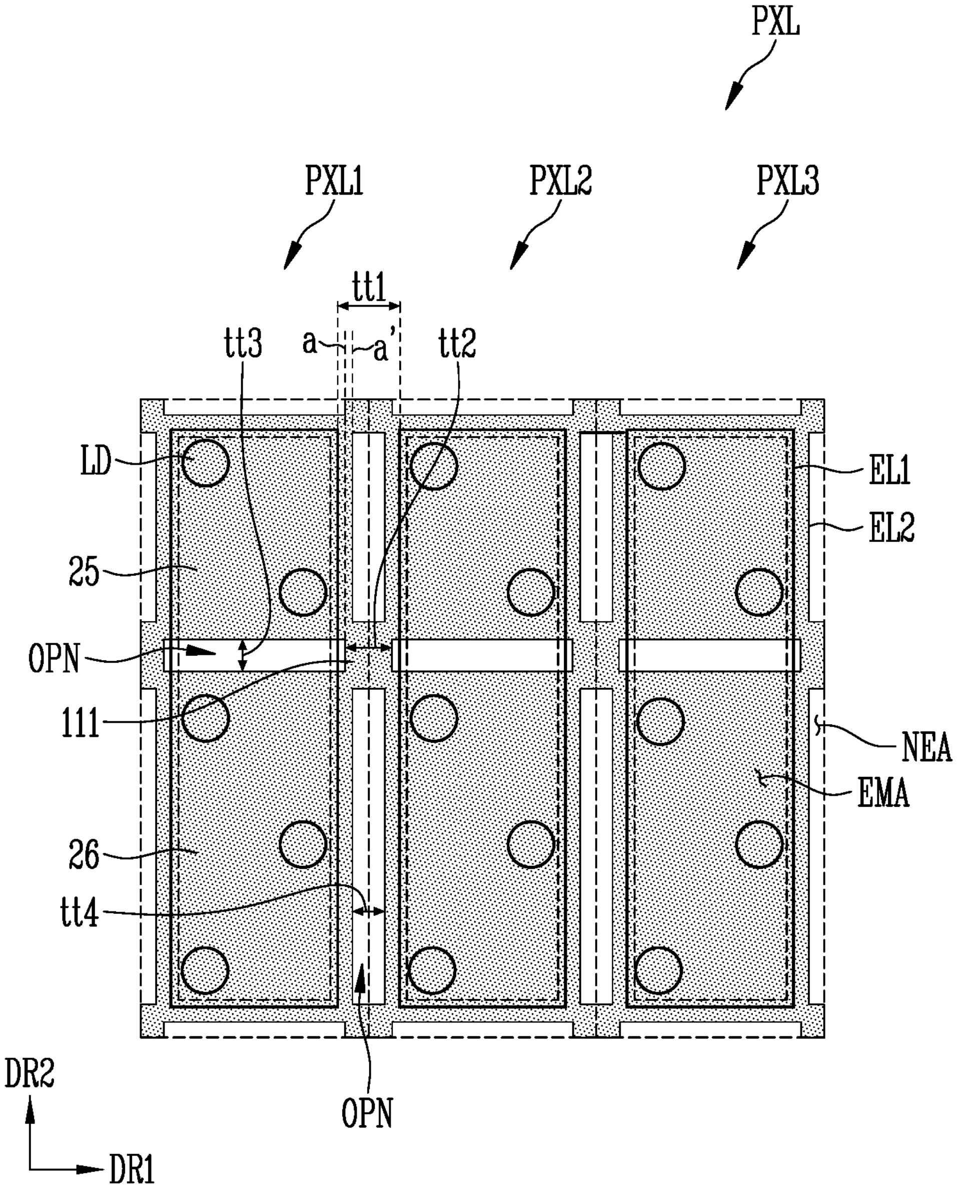
FIG. 25 to FIG. 27 illustrate schematic top plan views of a display device according to an embodiment.
Figure 26:
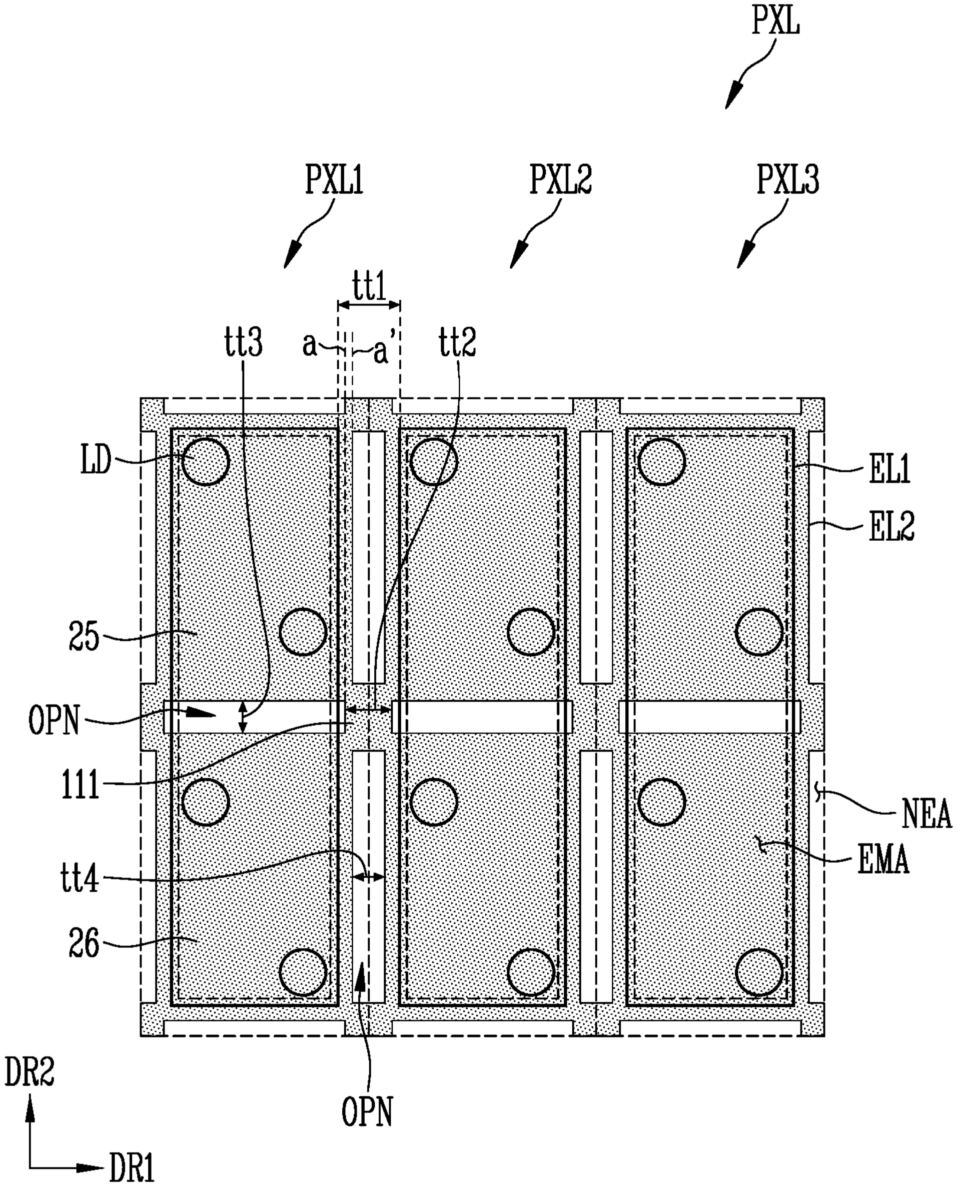
Figure 27:
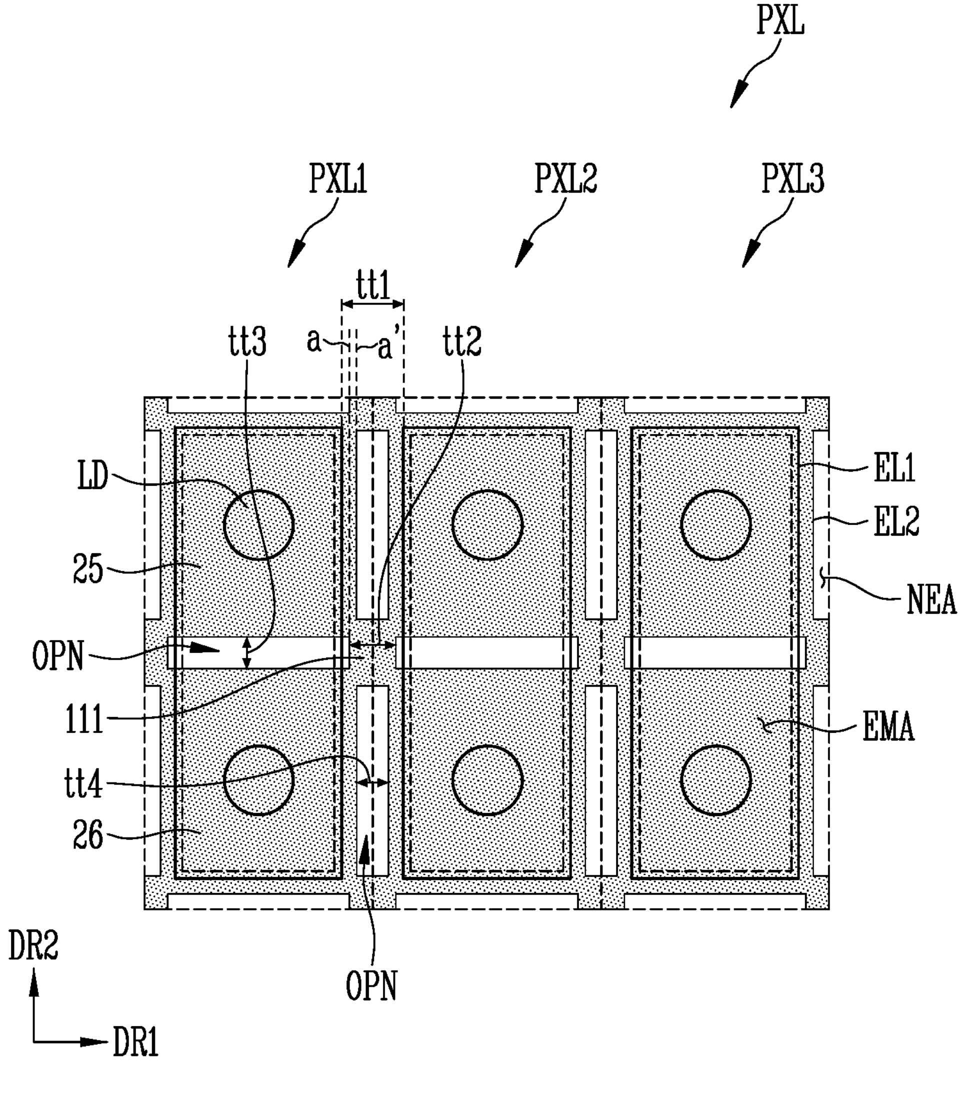

FIG. 25 to FIG. 27 illustrate schematic top plan views of a display device according to an embodiment. The display devices shown in FIG. 25 to FIG. 27 are similar to the display devices shown in FIG. 12 to FIG. 14 described above. The display devices shown in FIG. 25 to FIG. 27 include the same first electrode EL1 and light emitting element LD as the display devices shown in FIG. 12 to FIG. 14 described above, so a redundant description will be omitted below.

Referring to FIG. 25 to FIG. 27, the second electrode EL2 may include an upper plate part 25, a lower plate part 26, and a bridge 111.

The upper plate part 25 and the lower plate part 26 overlap at least one light emitting element LD. For example, referring to FIG. 25, the upper plate part 25 may overlap two light emitting elements LD, and the lower plate part 26 may overlap three light emitting elements LD. Referring to FIG. 26, the upper plate part 25 may overlap two light emitting elements LD, and the lower plate part 26 may overlap two light emitting elements LD. Referring to FIG. 27, the upper plate part 25 may overlap one light emitting element LD, and the lower plate part 26 may overlap one light emitting element LD.

The upper plate part 25 and the lower plate part 26 may be disposed in the light emitting area EMA and the non-light emitting area NEA, and the bridge 111 may be disposed only in the non-light emitting area NEA. The bridge 111 may not overlap the light emitting element LD.

The opening OPN does not overlap the light emitting element LD.

The upper plate part 25 may be disposed to be spaced apart from the lower plate part 26 with the opening OPN interposed therebetween along the second direction DR2.

The bridge 111 is a part extending from each of adjacent corners of the upper plate part 25 and the lower plate part 26 of pixels adjacent to each other along the first direction DR1. For example, the bridge 111 is a part extending from each of adjacent corners of the upper plate part 25 of the first sub-pixel PXL1, the lower plate part 26 of the first sub-pixel PXL1, the upper plate part 25 of the second sub-pixel PXL2, and the lower plate part 26 of the second sub-pixel PXL2.

In an embodiment, a distance tt1 between the first electrodes EL1 of pixels adjacent to each other along the first direction DR1 may be larger than a width tt2 of the bridge 111.

Both sides of the bridge 111 along the first direction DR1 may be disposed to not overlap the first electrode EL1. A part of the second electrode EL2 disposed between an imaginary line (a) extending in the second direction DR2 from one side or a side of the bridge 111 and an imaginary line (a') extending in the second direction DR2 from one side or a side of the second electrode EL2 may be disposed spaced apart from the first electrode EL1.

In an embodiment, a distance tt3 between one side or a side of the upper panel part 25 and one side or a side of the lower panel part 26 (or a width of the opening OPN between the upper plate part 25 and the lower plate part 26 in the same pixel) may be the same as a distance tt4 between one side or a side of the second electrode EL2 of the first sub-pixel PXL1 and one side or a side of the second electrode EL2 of the second sub-pixel PXL2 (or a width of the opening OPN between pixels adjacent to each other in the first direction DR1).

In an embodiment, the distance tt3 between one side or a side of the upper plate part 25 and one side or a side of the lower plate part 26 may be larger than the distance tt4 between one side or a side of the second electrode EL2 of the first sub-pixel PXL1 and one side or a side of the second electrode EL2 of the second sub-pixel PXL2. The distance tt1 between the first electrodes EL1 of pixels adjacent to each other along the first direction DR1 may be sufficiently secured.

As the distance tt4 between one side or a side of the second electrode EL2 and the one side or a side of the second electrode EL2 of the second sub-pixel PXL2 becomes narrower, a part of the second electrode EL2 disposed between the imaginary line (a) extending from one side or a side of the bridge 111 in the second direction DR2 and the imaginary line (a') extending from one side or a side of the second electrode EL2 in the second direction DR2 may be disposed to be sufficiently spaced apart from the first electrode EL1.

Since the display device according to an embodiment may include the second electrode EL2 of a shape capable of independently driving only at least one light emitting element LD in one pixel PXL, even if a part of the second electrode EL2 is cut, light emission of the light emitting elements LD present in the remaining parts except for the light emitting element LD overlapping the cut part thereof is not affected. For example, the display device shown in FIG. 25 to FIG. 27 may laser-cut the four corners of the bridge 111.

Therefore, the display device according to an embodiment may minimize the repair risk in case that a dark spot defect and/or a bright spot defect of the pixel PXL occurs.

Hereinafter, a structure of a display device according to an embodiment will be described with reference to FIG. 28.

Figure 28:
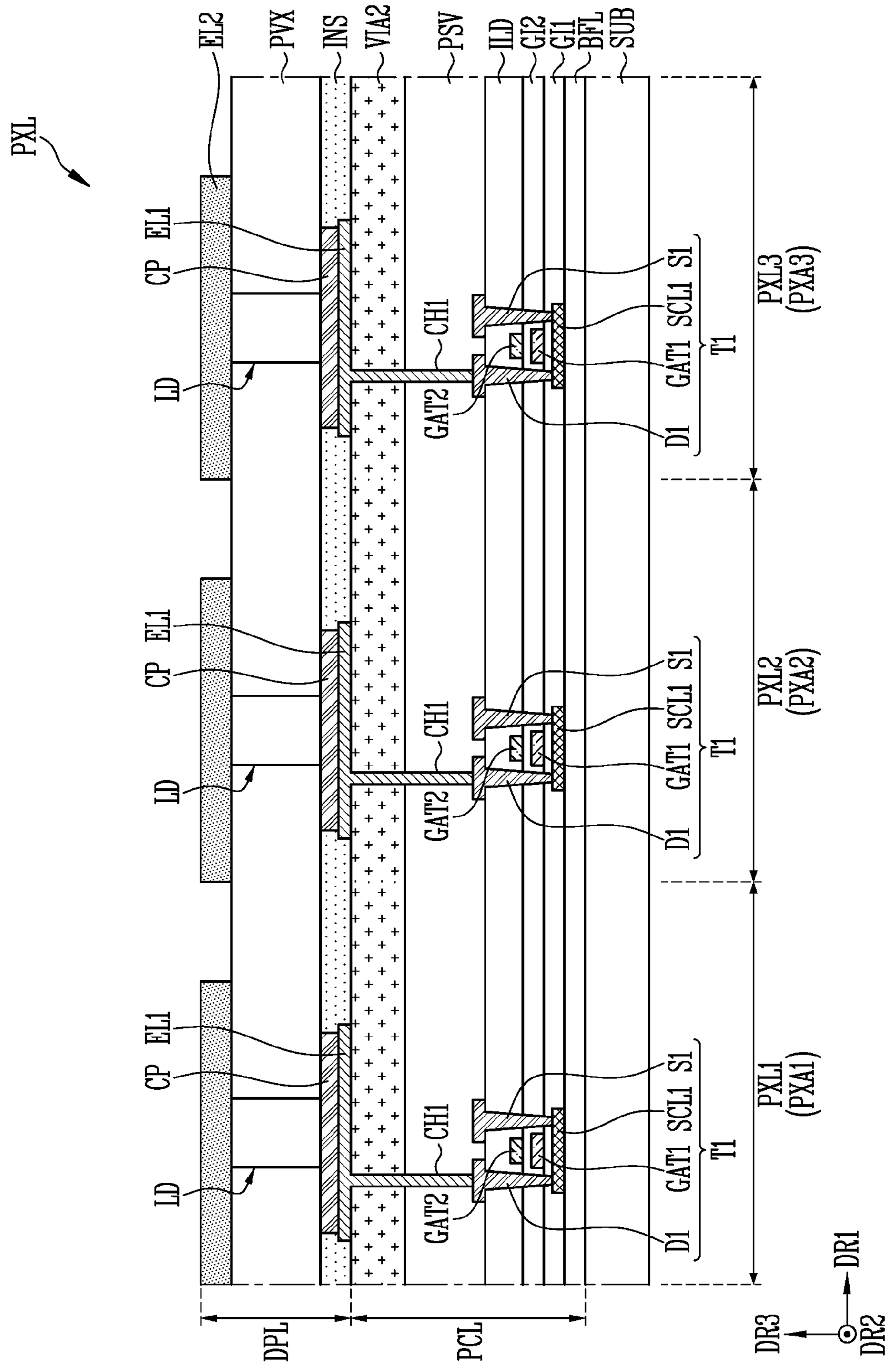
FIG. 28 illustrates a schematic cross-sectional view of a pixel included in a display device according to an embodiment.

FIG. 28 illustrates a schematic cross-sectional view of a pixel included in a display device according to an embodiment.

Referring to FIG. 28, one pixel PXL included in the display device according to an embodiment may include the base layer BSL, the pixel circuit layer PCL, and the display element layer DPL. Since the display device shown in FIG. 28 may have the same constituent elements as the display device of FIG. 8 described above, a redundant description thereof will be omitted below.

One pixel PXL may include the first sub-pixel PXL1 (corresponding to pixel area PXA1), the second sub-pixel PXL2 (corresponding to pixel area PXA2), and the third sub-pixel PXL3 (corresponding to pixel area PXA3) that may be disposed adjacent to each other in the first direction DR1.

Each of the first sub-pixel PXL1, the second sub-pixel PXL2, and the third sub-pixel PXL3 may include the first transistor T1. The first transistor T1 may include the first semiconductor pattern SCL1, the first gate electrode GAT1, the first source electrode S1, and the first drain electrode D1.

The display element layer DPL may include the first electrode EL1, the bonding electrode CP, the light emitting elements LD, the protective layer PVX, and the second electrode EL2. An insulating layer INS may also be disposed between the second via layer VIA2 and the protective layer PVX.

Respective first electrodes EL1 of the first sub-pixel PXL1, the second sub-pixel PXL2, and the third sub-pixel PXL3 may be disposed to be spaced apart from each other.

The second electrode EL2 may be disposed to partially cover or overlap the upper surface of the display element layer DPL. The display device according to an embodiment may minimize the repair risk by realizing the second electrode EL2 in various shapes in order to improve the dark spot defect or the bright spot defect of the pixel. The various shapes of the second electrode EL2 may correspond to those of the second electrode EL2 shown in FIG. 9 to FIG. 15 and FIG. 24 to FIG. 27 described above.

While the disclosure has been shown and described with reference to embodiments thereof, it will be understood by those skilled in the art that various changes in forms and details may be made therein without departing from the spirit and scope of the disclosure as defined by the appended claims and their equivalents.

Therefore, the scope of the disclosure may be determined by on the scope of the accompanying claims.

What is claimed is:

1. A display device comprising:

a pixel having a plane extending in a first direction and a second direction, the first and second directions being perpendicular, wherein the pixel includes:

a first electrode;

at least one light emitting element disposed on the first electrode; and a second electrode including at least one overlapping part overlapping the at least one light emitting element and including at least one opening not overlapping the at least one light emitting element, wherein one of:

the second electrode is formed of connected rectangular parts with the at least one light emitting element provided as four or five light emitting elements arranged in a zigzag formation and each one of the four or five light emitting elements is encompassed within a corresponding one of the connected rectangular parts, and the second electrode is formed of elongate parts that extend in a diagonal direction, which is defined diagonally with respect to the first and second directions, with the at least one light emitting element provided as four light emitting elements arranged in a zigzag formation and each one of the four light emitting elements is encompassed within a corresponding one of the elongate parts.

2. The display device of claim 1, wherein the at least one light emitting element includes a first light emitting element, a second light emitting element, a third light emitting element, a fourth light emitting element, and a fifth light emitting element, and the second electrode includes a first overlapping part, a second overlapping part, a third overlapping part, a fourth overlapping part, and a fifth overlapping part that overlaps the first light emitting element, the second light emitting element, the third light emitting element, the fourth light emitting element, and the fifth light emitting element, respectively.

3. The display device of claim 2, wherein a line extending to the second overlapping part from the first overlapping part extends in a first diagonal direction, which is defined diagonally with respect to the first and second directions;

a line extending to the third overlapping part from the second overlapping part extends in a second diagonal direction, which is defined diagonally with respect to the first and second directions;

a line connecting the fourth overlapping part from the third overlapping part extends in the first diagonal direction; and a line connecting the fifth overlapping part from the fourth overlapping part extends in the second diagonal direction.

4. The display device of claim 3, wherein the third overlapping part is spaced apart from the first overlapping part with the at least one opening of the second electrode disposed between the third overlapping part and the first overlapping part in the second direction;

the fourth overlapping part is spaced apart from the second overlapping part with the at least one opening of the second electrode disposed between the fourth overlapping part and the second overlapping part in the second direction; and the fifth overlapping part is spaced apart from the third overlapping part with the at least one opening of the second electrode disposed between the fifth overlapping part and the third overlapping part in the second direction.

5. The display device of claim 3, wherein the third overlapping part is spaced apart from the first overlapping part with only one opening of the second electrode disposed between the third overlapping part and the first overlapping part in a vertical direction;

the fourth overlapping part is spaced apart from the second overlapping part with only one opening of the second electrode disposed between the fourth overlapping part and the second overlapping part in the vertical direction; and the fifth overlapping part is spaced apart from the third overlapping part with only one opening of the second electrode disposed between the fifth overlapping part and the third overlapping part in the vertical direction.

6. The display device of claim 4, wherein the pixel includes a first sub-pixel, a second sub-pixel, and a third sub-pixel disposed side by side in the first direction; and each of the first sub-pixel, the second sub-pixel, and the third sub-pixel includes the first electrode, at least one light emitting element, and the second electrode.

7. The display device of claim 6, wherein a line extending to the second overlapping part of the first sub-pixel from the third overlapping part of the second sub-pixel extends in the first diagonal direction, and a line extending to the second overlapping part of the first sub-pixel from the first overlapping part of the second sub-pixel extends in the second diagonal direction; and a line extending to the third overlapping part of the third sub-pixel from the second overlapping part of the second sub-pixel extends in the first diagonal direction, and a line extending to the third overlapping part of the third sub-pixel from the fourth overlapping part of the second sub-pixel extends in the second diagonal direction.

8. The display device of claim 1, wherein the second electrode includes a first overlapping part, a second overlapping part, a third overlapping part, a fourth overlapping part, and a bridge; and each of the first overlapping part, the second overlapping part, the third overlapping part, and the fourth overlapping part overlaps a corresponding one of the at least one light emitting element.

9. The display device of claim 8, wherein the second overlapping part extends in a first diagonal direction from the first overlapping part through the bridge;

the third overlapping part extends in a second diagonal direction from the second overlapping part through the bridge;

the fourth overlapping part extends in the first diagonal direction from the third overlapping part through the bridge;

the third overlapping part is spaced apart from the first overlapping part with the opening of the second electrode disposed between the third overlapping part and the first overlapping part in a vertical direction; and the fourth overlapping part is spaced apart from the second overlapping part with the opening of the second electrode disposed between the fourth overlapping part and the second overlapping part in the vertical direction.

10. The display device of claim 9, wherein the pixel includes a first sub-pixel, a second sub-pixel, and a third sub-pixel disposed side by side in a horizontal direction;

each of the first sub-pixel, the second sub-pixel, and the third sub-pixel includes the first electrode, at least one light emitting element, and the second electrode; and the overlapping parts of the first sub-pixel, the second sub-pixel, and the third sub-pixel extend from each other through the bridge.

11. The display device of claim 10, wherein the second overlapping part of the first sub-pixel extends from the third overlapping part of the second sub-pixel in the first diagonal direction through the bridge, and extends from the first overlapping part of the second sub-pixel in the second diagonal direction through the bridge; and the second overlapping part of the second sub-pixel extends from the third overlapping part of the third sub-pixel in the first diagonal direction through the bridge, and extends from the first overlapping part of the third sub-pixel in the second diagonal direction through the bridge.

12. The display device of claim 11, wherein an edge of the overlapping part of the first sub-pixel overlapping an x-th light emitting element of the at least one light emitting element of the first sub-pixel is cut in case that a dark spot defect occurs in the x-th light emitting element, where x is a natural number.

13. The display device of claim 11, wherein an edge of the second electrode overlapping the third sub-pixel is cut in case that a bright spot occurs in the third sub-pixel.

14. The display device of claim 1, wherein the at least one overlapping part overlaps an entirety of each of the at least one light emitting element, the at least one opening not overlapping any of the at least one light emitting element.

15. The display device of claim 1, wherein the second electrode is comprised of a transparent conductive material selected from a group consisting of ITO, IZO, ZnO, IGZO, ITZO, and PE-DOT, and light produced by the at least one light emitting element is viewed from an outside through the second electrode.

* * * * *